US011380617B2

(12) United States Patent
Jezewski et al.

(10) Patent No.: US 11,380,617 B2
(45) Date of Patent: Jul. 5, 2022

(54) METHOD OF FORMING HIGH DENSITY, HIGH SHORTING MARGIN, AND LOW CAPACITANCE INTERCONNECTS BY ALTERNATING RECESSED TRENCHES

(71) Applicant: Intel Corporation, Santa Clara, CA (US)

(72) Inventors: Christopher J. Jezewski, Hillsboro, OR (US); Jasmeet S. Chawla, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/903,304

(22) Filed: Feb. 23, 2018

(65) Prior Publication Data

US 2018/0182702 A1    Jun. 28, 2018

Related U.S. Application Data

(63) Continuation of application No. 15/201,420, filed on Jul. 2, 2016, now Pat. No. 9,911,694, which is a
(Continued)

(51) Int. Cl.
*H01L 23/528* (2006.01)
*H01L 21/768* (2006.01)
(Continued)

(52) U.S. Cl.
CPC ...... *H01L 23/528* (2013.01); *H01L 21/02126* (2013.01); *H01L 21/0337* (2013.01);
(Continued)

(58) Field of Classification Search
CPC ....... H01L 21/76816; H01L 21/76838–76895; H01L 23/522–5389; H01L 23/5226
See application file for complete search history.

(56) References Cited

U.S. PATENT DOCUMENTS

| 5,891,799 A | * | 4/1999 | Tsui | .................. | H01L 21/31116 |
| | | | | | 257/E21.252 |
| 6,429,105 B1 | * | 8/2002 | Kunikiyo | .......... | H01L 21/76801 |
| | | | | | 257/E21.576 |

(Continued)

FOREIGN PATENT DOCUMENTS

| TW | 200739813 | 10/2007 |
| TW | 201010065 | 3/2010 |

OTHER PUBLICATIONS

Office Action and Search Report for Taiwan Patent Application No. 105119974, dated Mar. 2, 2017, 7 pages.
(Continued)

*Primary Examiner* — Stephen M Bradley
(74) *Attorney, Agent, or Firm* — Schwabe, Williamson & Wyatt, P.C.

(57) ABSTRACT

Embodiments of the invention describe low capacitance interconnect structures for semiconductor devices and methods for manufacturing such devices. According to an embodiment of the invention, a low capacitance interconnect structure comprises an interlayer dielectric (ILD). First and second interconnect lines are disposed in the ILD in an alternating pattern. The top surfaces of the first interconnect lines may be recessed below the top surfaces of the second interconnect lines. Increases in the recess of the first interconnect lines decreases the line-to-line capacitance between neighboring interconnects. Further embodiments include utilizing different dielectric materials as etching caps above the first and second interconnect lines. The different materials may have a high selectivity over each other during an etching process. Accordingly, the alignment budget for contacts to individual interconnect lines is increased.

20 Claims, 16 Drawing Sheets

Related U.S. Application Data continuation of application No. 14/709,430, filed on May 11, 2015, now Pat. No. 9,385,082, which is a continuation of application No. 14/139,363, filed on Dec. 23, 2013, now Pat. No. 9,054,164.

(51) Int. Cl.
  *H01L 23/522* (2006.01)
  *H01L 23/532* (2006.01)
  *H01L 21/033* (2006.01)
  *H01L 21/02* (2006.01)
  *H01L 21/311* (2006.01)

(52) U.S. Cl.
  CPC ... *H01L 21/31111* (2013.01); *H01L 21/31144* (2013.01); *H01L 21/76802* (2013.01); *H01L 21/76816* (2013.01); *H01L 21/76834* (2013.01); *H01L 21/76877* (2013.01); *H01L 21/76879* (2013.01); *H01L 21/76897* (2013.01); *H01L 23/5222* (2013.01); *H01L 23/5226* (2013.01); *H01L 23/5283* (2013.01); *H01L 23/5329* (2013.01); *H01L 23/53295* (2013.01); *H01L 2924/0002* (2013.01)

(56) References Cited

U.S. PATENT DOCUMENTS

| | | | |
|---|---|---|---|
| 6,657,302 B1 | 12/2003 | Shao et al. | |
| 6,731,007 B1* | 5/2004 | Saito | H01L 21/76838 257/762 |
| 8,664,113 B2* | 3/2014 | Kim | H01L 23/5226 257/48 |
| 9,054,164 B1 | 6/2015 | Jezewski et al. | |
| 9,330,974 B2* | 5/2016 | Kim | H01L 21/7681 |
| 9,385,082 B2 | 7/2016 | Jezewski et al. | |
| 2004/0251549 A1* | 12/2004 | Huang | H01L 21/76804 257/758 |
| 2005/0106858 A1* | 5/2005 | Cheng | H01L 21/76801 438/643 |
| 2006/0170108 A1 | 8/2006 | Hiroi | |
| 2006/0244133 A1 | 11/2006 | Chen et al. | |
| 2007/0007658 A1 | 1/2007 | Tomita et al. | |
| 2007/0077743 A1 | 4/2007 | Rao et al. | |
| 2007/0235878 A1 | 10/2007 | Bambino et al. | |
| 2008/0258308 A1* | 10/2008 | Liu | H01L 21/02063 257/774 |
| 2009/0200683 A1 | 8/2009 | Colburn et al. | |
| 2009/0286346 A1 | 11/2009 | Adkisson et al. | |
| 2009/0309230 A1 | 12/2009 | Cui et al. | |
| 2010/0123213 A1 | 5/2010 | Chen et al. | |
| 2010/0270674 A1* | 10/2010 | Zhu | H01L 23/522 257/758 |
| 2011/0162874 A1 | 7/2011 | Nguyen et al. | |
| 2011/0162875 A1 | 7/2011 | Cheng et al. | |
| 2011/0193230 A1 | 8/2011 | Nogamie et al. | |
| 2012/0223437 A1 | 9/2012 | Heinrich et al. | |
| 2012/0244698 A1 | 9/2012 | Ryan | |
| 2012/0313072 A1 | 12/2012 | Baek et al. | |
| 2014/0056053 A1 | 2/2014 | Ramaswamy et al. | |
| 2014/0084465 A1 | 3/2014 | Zhang et al. | |

OTHER PUBLICATIONS

Taiwanese Search Report dated Dec. 14, 2015 for corresponding Taiwanese Application No. 103140471, 1 page.

* cited by examiner

METHOD OF FORMING HIGH DENSITY, HIGH SHORTING MARGIN, AND LOW CAPACITANCE INTERCONNECTS BY ALTERNATING RECESSED TRENCHES

CROSS-REFERENCE TO RELATED APPLICATIONS

This application is a continuation of and claims the benefit of U.S. patent application Ser. No. 15/201,420, filed Jul. 2, 2016, which is a continuation of U.S. patent application Ser. No. 14/709,430, filed May 11, 2015, now U.S. Pat. No. 9,385,082 issued on Jul. 5, 2016, which is a continuation of U.S. patent application Ser. No. 14/139,363, titled "Method of Forming High Density, High Shorting Margin, and Low Capacitance Interconnects by Alternating Recessed Trenches", filed Dec. 23, 2013, now U.S. Pat. No. 9,054,164 issued on Jun. 9, 2015, the entire contents of which is hereby incorporated by reference in its entirety for all purposes.

FIELD OF THE INVENTION

Embodiments of the present invention relate generally to the manufacture of semiconductor devices. In particular, embodiments of the present invention relate to low capacitance interconnect structures for semiconductor devices and methods for manufacturing such devices.

BACKGROUND AND RELATED ARTS

As microprocessors become faster and smaller, integrated circuitry (IC) becomes more complex and components become more densely packed. Interconnect lines are needed to provide electrical connections to different portions of the device. The current patterning technique for forming interconnect lines includes the formation of trenches that have a uniform depth, as shown in FIG. 1. Conductive material is then disposed into the trenches to form interconnect lines 120. However, as the pitch of the interconnect lines decrease, increases in the line-to-line capacitances between neighboring interconnect lines becomes a limiting factor. Prior attempts to decrease the line-to-line capacitance rely on low-k dielectric materials and techniques such as using air pockets. However, these approaches are limited by material properties and generally result in poor structural integrity.

In addition to the increase in the line-to-line capacitance, shrinking the pitch of the interconnect lines increases the demands on masking and etching processes required for the formation of connections to the interconnect lines from subsequent layers. In FIG. 1, a contact mask 160 is disposed over the etch stop layer 105. In order to make a contact to a single interconnect line 120, the contact mask 160 must be patterned to have a mask opening M that is aligned over a single interconnect line 120. If the mask opening M is misaligned and extends over a neighboring interconnect line 120, as shown in FIG. 1, then the etching process would provide contacts to both interconnect lines, thereby preventing the formation of an isolated connection. Accordingly, reducing the pitch of the interconnect lines requires aligning and patterning contact masks with increased precision that may not be obtainable with conventional lithography processes.

DETAILED DESCRIPTION

Embodiments of the invention are directed towards an interconnect structure with reduced line-to-line capacitance and methods of making such devices. In order to reduce the line-to-line capacitance in an interconnect structure, the effective distance between neighboring interconnect lines is increased. Embodiments of the invention increase the effective distance between neighboring interconnect lines by recessing alternating lines. Embodiments of the invention include first interconnect lines that are recessed into an interlayer dielectric such that their top surfaces are disposed below the top surfaces of neighboring second interconnect lines. According to additional embodiments, the first interconnect lines are recessed into the interlayer dielectric such that their top surfaces are disposed below the bottom surfaces of neighboring second interconnect lines. The decrease in line-to-line capacitance is strongly proportional to increases in the recess depth of the first interconnect lines. Accordingly, reductions in the line-to-line capacitance made in accordance with embodiments of the present invention are not solely dependent on the dielectric constant of the materials used for the interlayer dielectric. As such, embodiments of the invention may utilize dielectric materials that have higher dielectric constants relative to the prior art without increasing the line-to-line capacitance.

Figure 1:
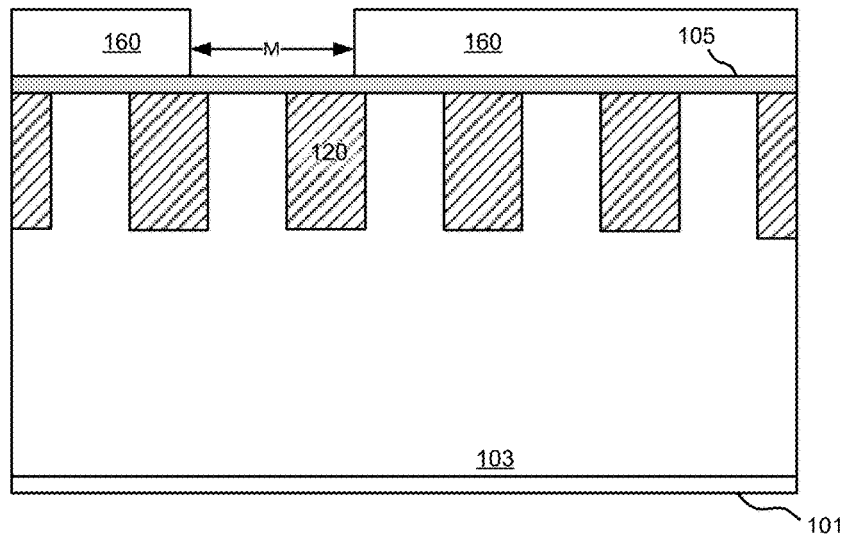
FIG. 1 illustrates an interconnect structure according to the prior art.

According to an embodiment of the invention, a first trench etching process is used to form the trenches in which the first interconnect lines are formed, and a second trench etching process is used to form the trenches in which the second interconnect lines are formed. Etching alternating trenches with separate etching processes allows for the interconnect lines to be formed in trenches that are different depths, as opposed to being formed in trenches of uniform depth, as shown in FIG. 1. Therefore, the first interconnect lines may be recessed below the second interconnect lines, thereby reducing the line-to-line capacitance in the interconnect structure.

Additional embodiments of the invention also utilize two different dielectric materials for the first and second dielectric caps. Embodiments include an interconnect structure with first dielectric caps that have a high selectivity over the second dielectric caps during an etching process. Additional embodiments further include first and second dielectric caps made from materials that both have a high selectivity over an etch-stop layer formed above the interlayer dielectric during an etching process. The use of materials that have high selectivity over each other during an etching process allows for the formation of contact openings that are more forgiving to misalignment. Since an etchant may be chosen that selectively removes only one of the materials, the mask opening may span across more than one interconnect line, thereby providing a large misalignment budget.

Figure 2A:
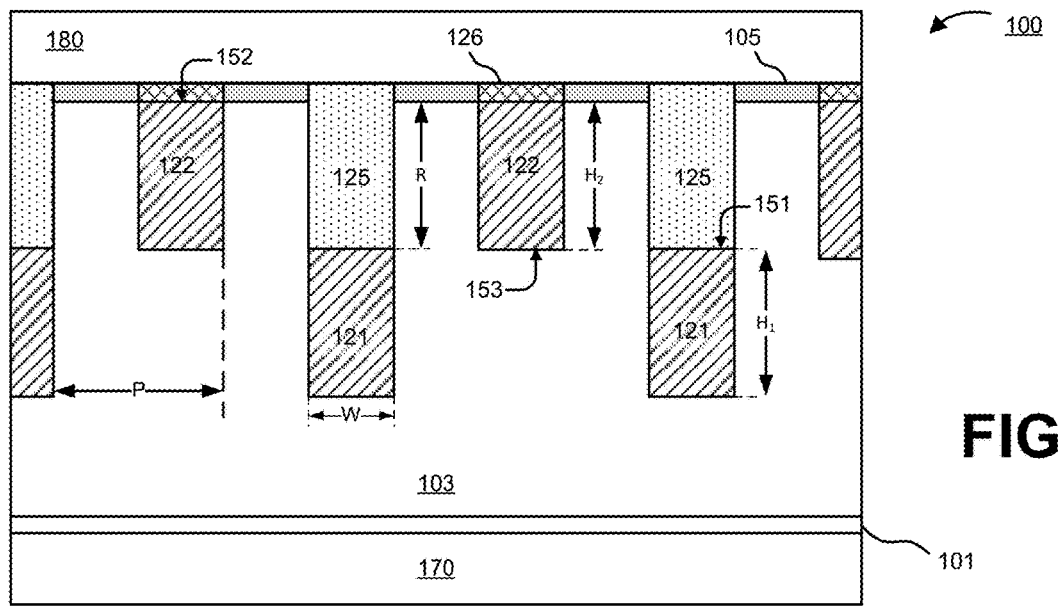
FIGS. 2A-2E illustrate cross-sectional views of an interconnect structure according to embodiments of the invention.

FIG. 2A illustrates a low capacitance interconnect structure 100 according to an embodiment of the invention. The interconnect structure 100 may be used in conjunction with any semiconductor device that utilizes multi-level interconnects, such as an IC circuit and the like. Interconnect structure 100 is formed in an interlayer dielectric (ILD) 103. Embodiments of the invention utilize low-k dielectric materials that are typically known in the art for use as ILDs such as, silicon dioxide. According to embodiments of the invention, low-k dielectric materials suitable for formation of the ILD 103 may also include, but are not limited to, materials such as carbon doped silicon dioxide, porous silicon dioxide, or silicon nitrides. Additional embodiments of the invention may include the ILD 103 formed from dielectric materials with k-values less than 5. Embodiments may also include an ILD with a k-value less than 2. According to additional embodiments, the ILD 103 may include air gaps and have a k-value of 1. According to embodiments of the invention, ILD 103 may be less than 100 nm thick. According to additional embodiments, the ILD 103 may be less than 40 nm thick. An additional embodiment of the invention may further include an ILD 103 with a thickness between 40 nm and 80 nm. Additional embodiments include an ILD 103 that is approximately 60 nm thick.

In an embodiment, an etch-stop layer 105, such as a nitride or an oxide, is disposed over the top surface of the ILD 103. According to an embodiment, etch-stop layer 105 is resistant to an etchant that may be used to etch through an additional layer 180, such as an additional interconnect layer, that may be disposed above the etch-stop layer 105. Embodiments of the invention include an etch-stop layer 105 that is between 3 nm and 10 nm thick. According to an embodiment, the low capacitance interconnect structure 100 may also have a bottom etch-stop layer 101, such as a nitride or an oxide material, disposed below the ILD 103. The lower etch-stop layer 101 may separate the ILD 103 from other interconnect structures or the active circuitry of a semiconductor device, such as layer 170. According to an embodiment, bottom etch-stop layer 101 is resistant to an etchant that may be used to etch through the ILD 103. Embodiments of the invention include a bottom etch-stop layer 101 that is between 3 nm and 10 nm thick.

According to an embodiment, interconnect structure 100 includes first and second interconnect lines 121, 122 disposed into the ILD 103 in an alternating pattern, as shown in FIG. 2A. According to an embodiment the alternating pattern includes a first interconnect line 121 bordered on each side by second interconnect lines 122. According to embodiments of the invention, the first and second interconnect lines 121, 122 are formed with conductive materials. By way of example, and not by way of limitation the conductive materials used to form the interconnect lines may include, Cu, Co, W, NiSi, TiN, Mo, Ni, Ru, Au, Ag, or Pt. According to an embodiment, the same metal is used to form both the first and second interconnect lines 121, 122. According to an alternative embodiment, the first and second interconnect lines 121, 122 are formed with different metals. The interconnect lines 121, 122 are spaced apart from each other by a pitch P. Embodiments of the invention include high density interconnect lines with a pitch P less than 60 nm. Further embodiments of the invention include a pitch P that is less than 30 nm. Embodiments of the invention include interconnect line widths W less than 30 nm. Additional embodiments of the invention include interconnect line widths W less than 15 nm. While the width W of the first and second interconnect lines 121, 122 are shown as being substantially equal in FIG. 2A, additional embodiments are not so limited. As such, further embodiments of the invention include first interconnect lines 121 that have a width W that is larger than or smaller than the width W of the second interconnect lines 122.

Figure 2B:
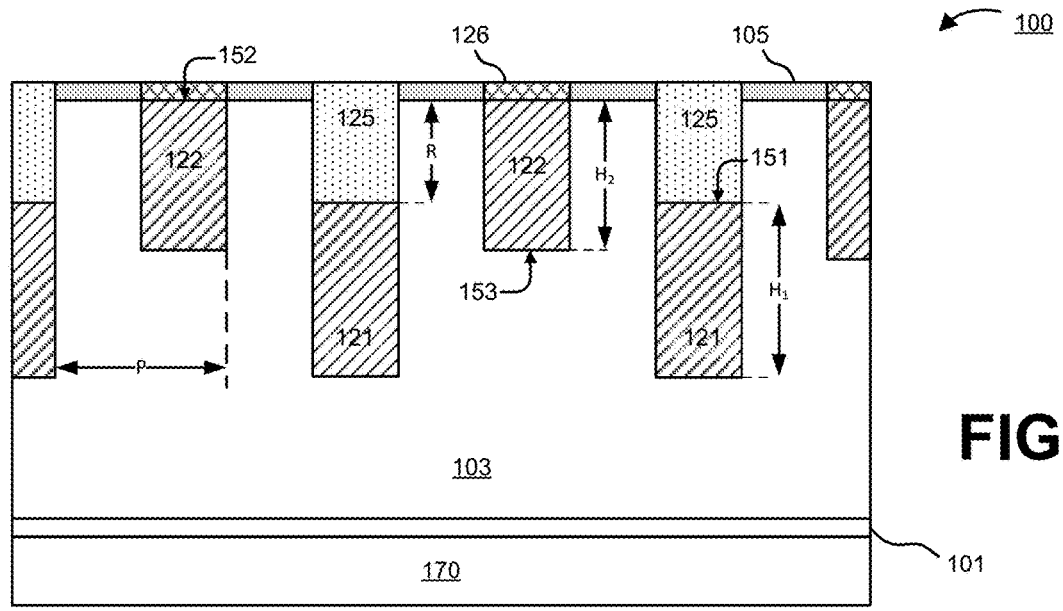
Figure 2C:
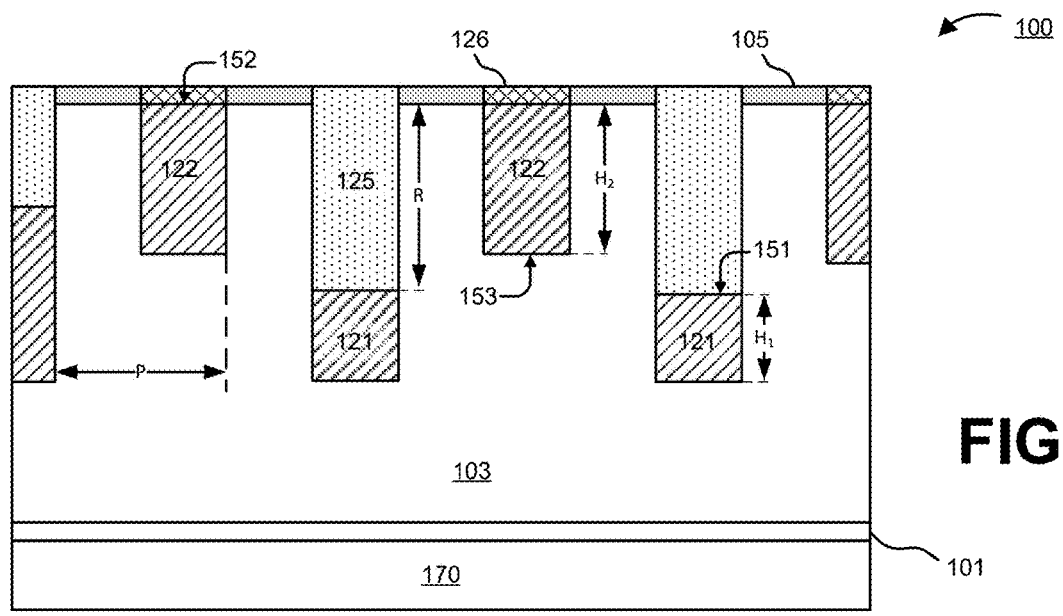

As shown in FIG. 2A, the top surfaces 151 of the first interconnect lines 121 are recessed a distance R into the ILD 103. According to embodiments of the invention, R is chosen such that the top surfaces 151 of the first interconnect lines 121 are disposed at substantially the same depth as the bottom surfaces 153 of the second interconnect lines 122, as shown in FIG. 2A. In additional embodiments of the invention, R is chosen such that the top surfaces 151 of the first interconnect lines 121 are formed between the top surfaces 152 and bottom surfaces 153 of the second interconnect lines 122, as shown in FIG. 2B. An arrangement according to this embodiment may be desirable when the thickness of the ILD 103 needs to be reduced. In an additional embodiment of the invention, R is chosen such that the top surfaces 151 of the first interconnect lines 121 are formed below the bottom surfaces 153 of the second interconnect lines 122, as shown in FIG. 2C. According to additional embodiments, the top surfaces 152 of the second interconnect lines 122 are also recessed into the ILD 103.

Referring back to FIG. 2A, embodiments of the invention include first interconnect lines 121 that are a height $H_1$ and second interconnect lines 122 have a height $H_2$. Embodiments of the invention include interconnect structures 100 where $H_1$ and $H_2$ are chosen to be the same height, as shown in FIG. 2A. According to additional embodiments, interconnect structure 100 includes first and second interconnect lines that have heights $H_1$ and $H_2$ that are not the same, as shown in FIG. 2B. While $H_1$ is shown in FIG. 2B as being larger than $H_2$, embodiments of the invention are not so limited. Alternative embodiments include interconnect structures 100 in which $H_1$ is smaller than $H_2$, as shown in FIG. 2C. According to embodiments of the invention, the first and second heights $H_1$ and $H_2$ are between 10 nm and 30 nm. According to an additional embodiment of the invention $H_1$ is approximately 24 nm and $H_2$ is approximately 16 nm.

Figure 3:
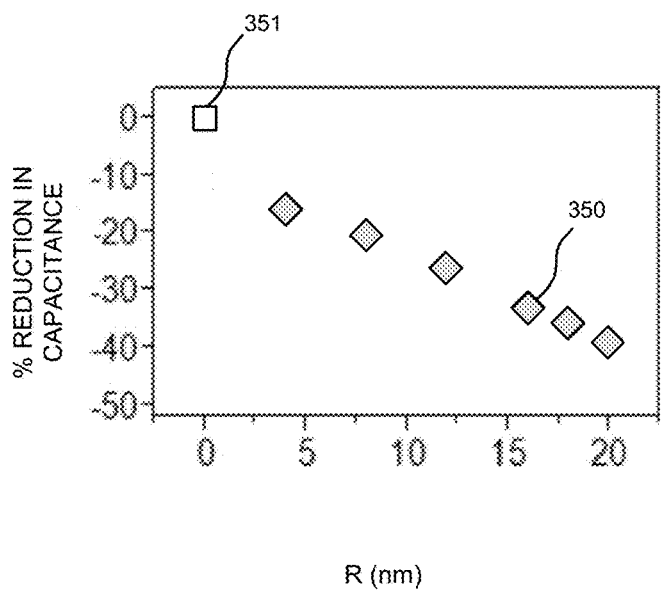
FIG. 3 illustrates a graph of the line-to-line capacitance with respect to the recess depth of alternating interconnect lines according to embodiments of the invention.

Referring now to FIG. 3, a graph of the relationship between reduction in the line-to-line capacitance and the depth of the recess R of the first interconnect lines 121 into the ILD 103 according to various embodiments of the invention is shown. The y-axis is a measurement of the reduction in the line-to-line capacitance (as a percent of the line-to-line capacitance of the prior art device depicted in FIG. 1), and the x-axis is the recess depth R (in nanometers) of the top surface 151 of the first interconnect lines 121. The box 351 is a reference marker of the line-to-line capacitance of the prior art device shown in FIG. 1. Box 351 therefore represents a device in which all interconnect lines 120 are formed at the same depth. The devices measured in FIG. 3 include second interconnect lines 122 that have a height $H_2$ of approximately 16 nm. Accordingly, marker 350 is the measurement where the top surfaces 151 of the first interconnect lines 121 are recessed completely below the bottom surface 153 of the second interconnect lines 122, as shown in FIG. 2A. By way of example, marker 350 indicates that the line-to-line capacitance may be reduced by approximately 35% when the first and second interconnects 121, 122 are completely offset from each other, as shown in FIG. 2A. The graph shows the decrease in the line-to-line capacitance is strongly proportional to the value chosen for the recess R of the first interconnect lines 121 into the ILD 103.

Referring back to FIG. 2A, embodiments of the invention further include a first dielectric cap 125 disposed above the first interconnect lines 121. The first dielectric cap 125 fills the remaining portion of the trench in which the first interconnect lines 121 are formed. According to an embodiment, top surfaces of the first dielectric caps 125 are substantially coplanar with the etch-stop layer 105. Embodiments of the invention further include a second dielectric cap 126 that is disposed above the second interconnect lines 122. The second dielectric cap 126 fills the remaining portion of the trench in which the second interconnect lines 121 are formed. According to an embodiment, a top surface of the second dielectric cap 126 is substantially coplanar with the etch-stop layer 105. Embodiments of the invention include first and second dielectric caps 125, 126 made from materials such as $SiO_xC_yN_z$, non-conductive metal oxides and nitrides, such as, but not limited to, TiO, ZrO, TiAlZrO, AlO, or organic materials. According to an embodiment, the first and second dielectric caps are made with the same material. According to an additional embodiment, first dielectric caps 125 and second dielectric caps 126 are made from different materials. According to an embodiment, the first dielectric caps 125 are made from a material that has a high selectivity over the second dielectric caps 126 during an etching process. As used herein, when a first material is stated as having a high selectivity over a second material, the first material etches at a faster rate than the second material during a given etching process. According to an additional embodiment, the second dielectric caps 126 are made from a material that has a high selectivity over the first dielectric caps 125. Additional embodiments of the invention include forming the first and second dielectric caps 125, 126 from different materials that both have a high selectivity over the etch stop layer 105 during an etching process.

In addition to reducing the line-to-line capacitance, the interconnect structure 100 may also provide benefits with respect to forming connections to individual interconnect lines. As shown in the prior art interconnect device in FIG. 1, precise alignment of the contact mask 160 is necessary because there is no etch selectivity between the neighboring interconnects 120. Therefore, in order to provide a connection to a single interconnect line, the mask opening M needed to be aligned over a single interconnect line in order to prevent the neighboring lines from being exposed as well. Accordingly, as the pitch of the interconnect lines continues to shrink, the need for an accurate alignment has become another hurdle to the production of semiconductor devices.

Figure 2D:
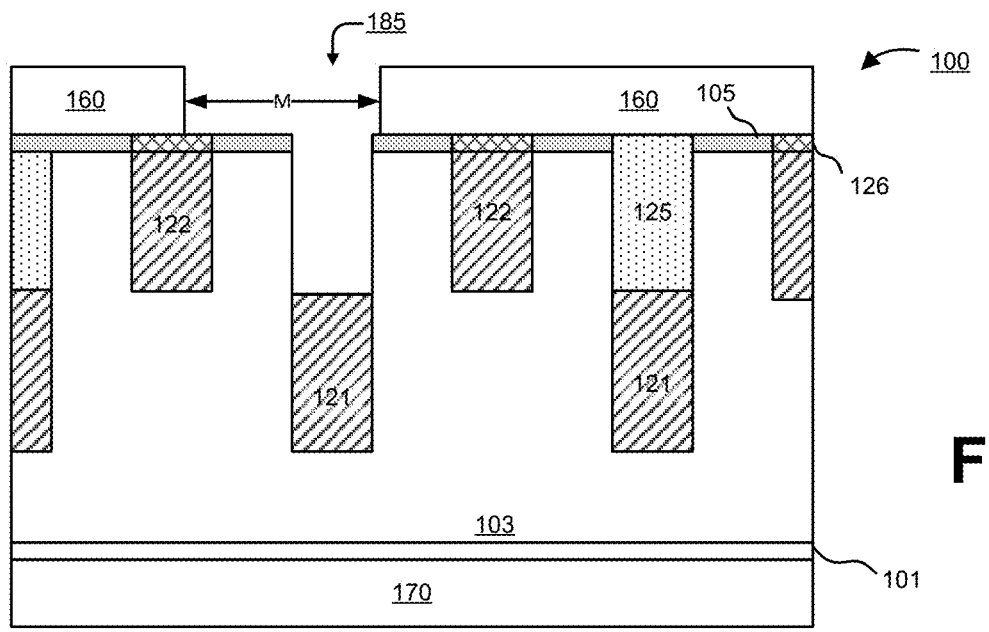

As shown in FIG. 2D, embodiments of the invention allow for the selective removal of the first dielectric cap 125 even though the mask 160 was misaligned. The selectivity shown in FIG. 2D is possible made possible in embodiments of the invention that utilize a material for the first dielectric cap 125 that has a high selectivity over the material used for the second dielectric cap 126 and over the etch-stop layer 105. Accordingly, even when the mask opening M is formed over the first interconnect line 121 and the neighboring second interconnect line 122, the first dielectric cap 125 can be selectively etched away to form contact opening 185 without also etching away the dielectric cap 126 disposed over the second interconnect line 122.

Figure 2E:
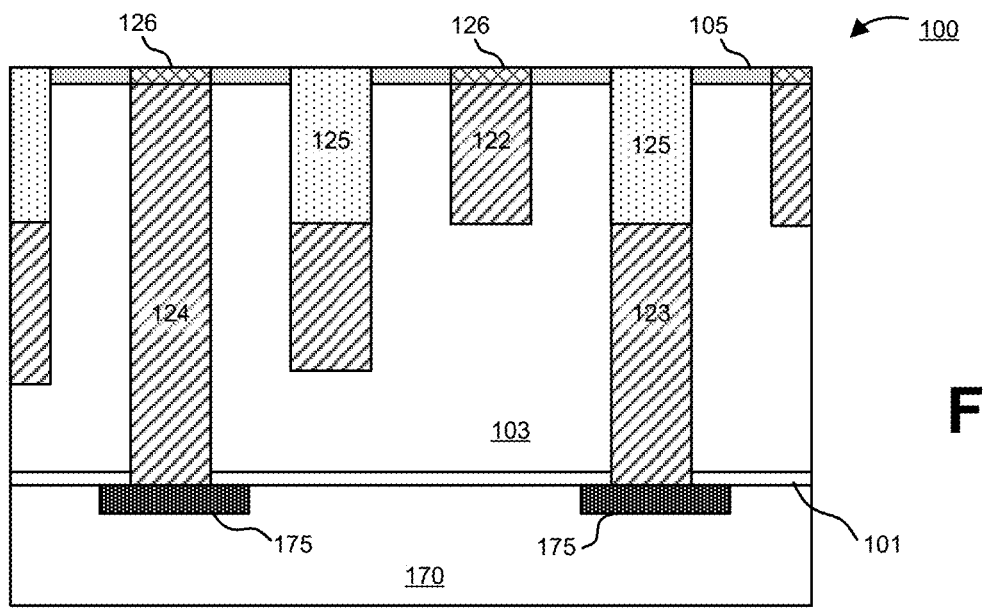

Referring now to FIG. 2E, a cross-sectional view of an interconnect device 100 according to an additional embodiment is shown. The interconnect device 100 in FIG. 2E is substantially similar to the one shown in FIG. 2A and further includes a first through via 123 and second through via 124. According to embodiments of the invention, the first and second through vias 123, 124 are integrated into the alternating pattern of the first and second interconnect lines 121, 122. As such, in embodiments of the invention, a first through via 123 is formed where a first interconnect line 121 would otherwise be formed. Similarly, embodiments include forming a second through via 124 where a second interconnect line 122 would otherwise be formed. As shown in FIG. 2E, the first through via is formed between two second interconnect lines 122, and the second through via 124 is formed between two first interconnect lines 121. First through vias 123 are substantially similar to the first interconnect lines 121, with the exception that the line is formed all the way through the ILD 103 and the bottom etch-stop layer 101. Accordingly, the first through via 123 provides the ability to make an electrical connection through the ILD 103 to the lower level 170. As shown in FIG. 2E, the electrical connection to the lower level 170 may be made to a pad 175 on the lower level 170. Pads 175 may be conductive lines, S/D contacts of a transistor device, or any other feature of a semiconductor device that requires an electrical connection, such as any region of 170 that is a portion of the interconnect scheme. Likewise, second through vias 124 are substantially similar to the second interconnect lines 122, with the exception that the line is formed all the way through the ILD 103 and the bottom etch-stop layer 101. Accordingly, the second through via 124 provides the ability to make an electrical connection through the ILD 103 to the lower level 170. Those skilled in the art will recognize that the through vias 123 and 124 need not extend along the entire length of an interconnect line (i.e., along the length of the line extending out of the plane of paper).

Embodiments of the invention further include first and second dielectric caps 125, 126 disposed above the first and second through vias 123, 124 that are substantially similar to those described above with respect to the dielectric caps disposed above the first and second interconnect lines 121, 122. Accordingly, embodiments allow for a mask opening M that is formed over the neighboring interconnect lines when a contact needs to be made to a through via, because of the etch selectivity between the first dielectric caps 125 and the second dielectric caps 126.

Figure 4A:
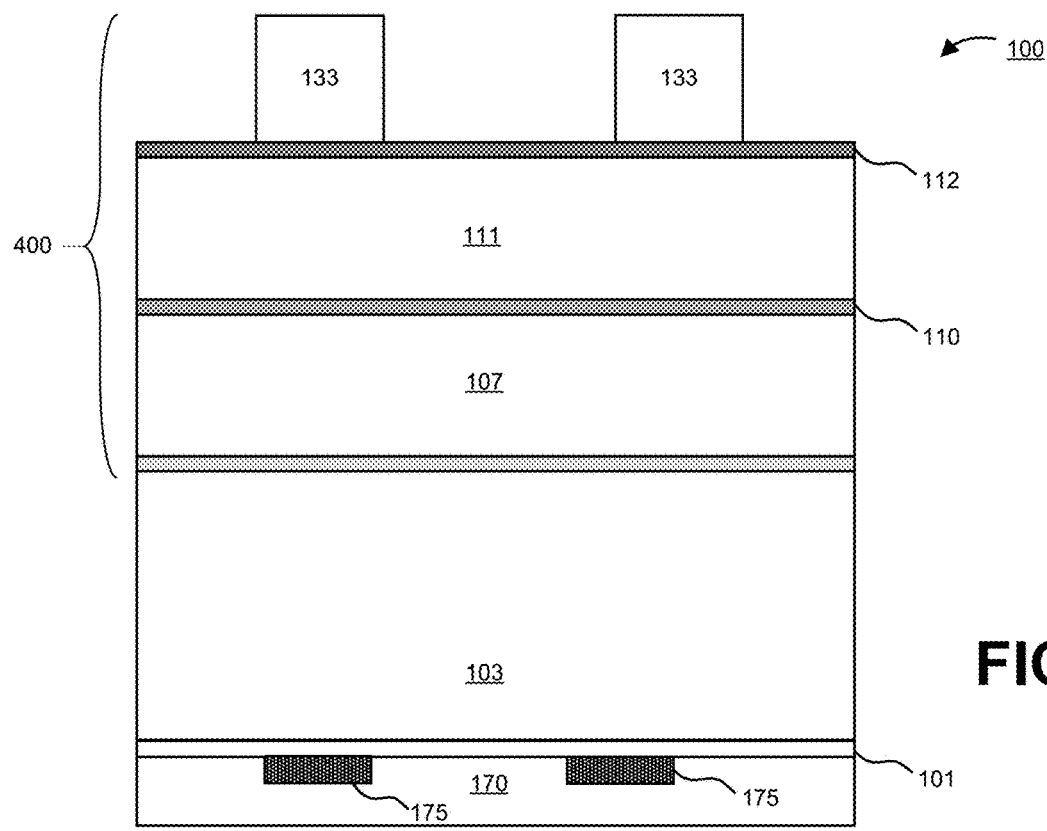
FIGS. 4A-4Q illustrate a processing flow for forming low capacitance interconnect structures according to embodiments of the invention.
Figure 4B:
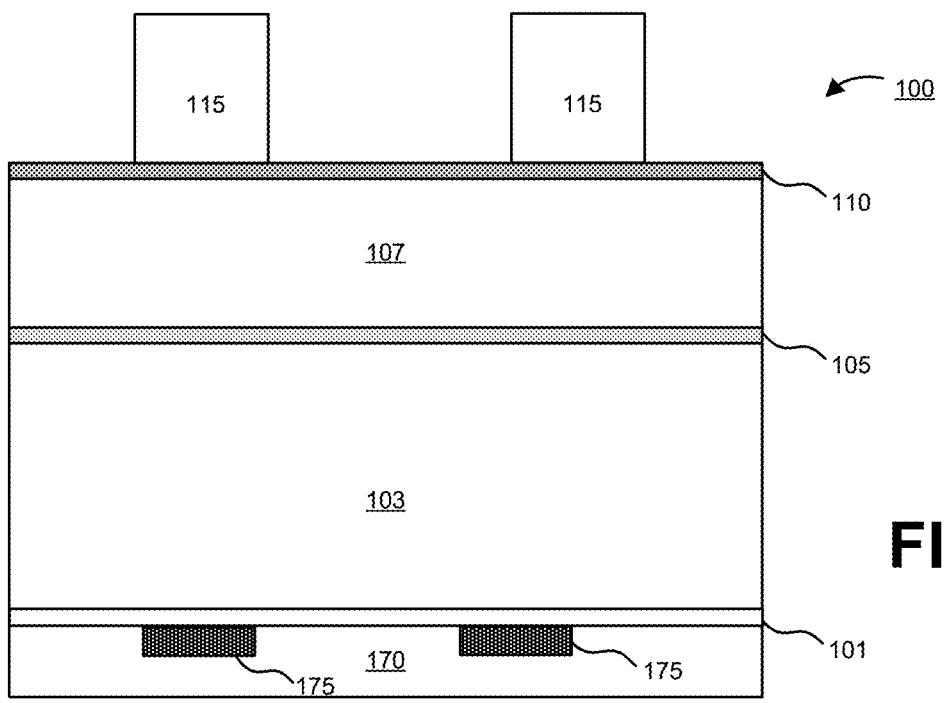
Figure 4C:
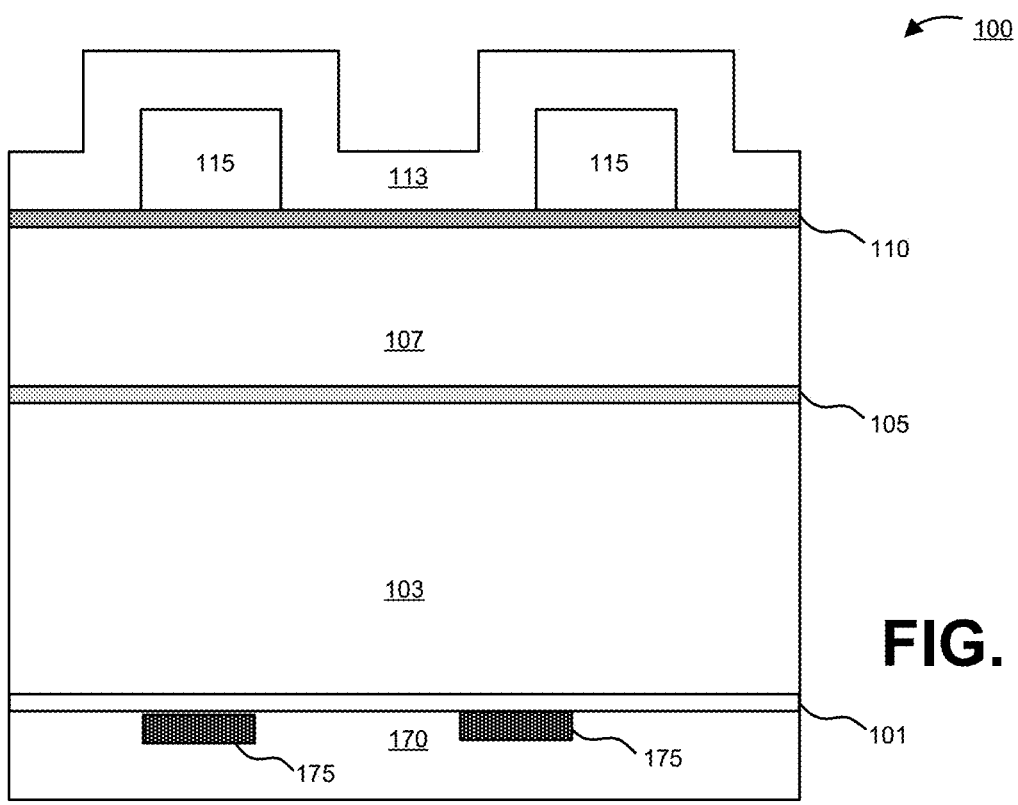
Figure 4D:
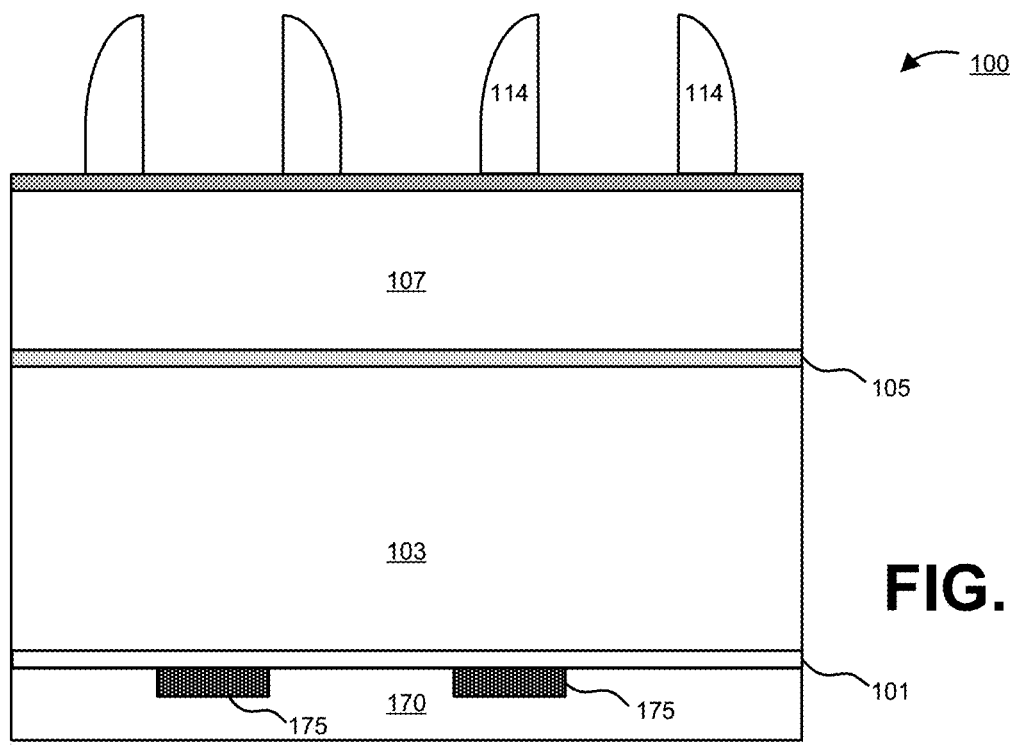
Figure 4E:
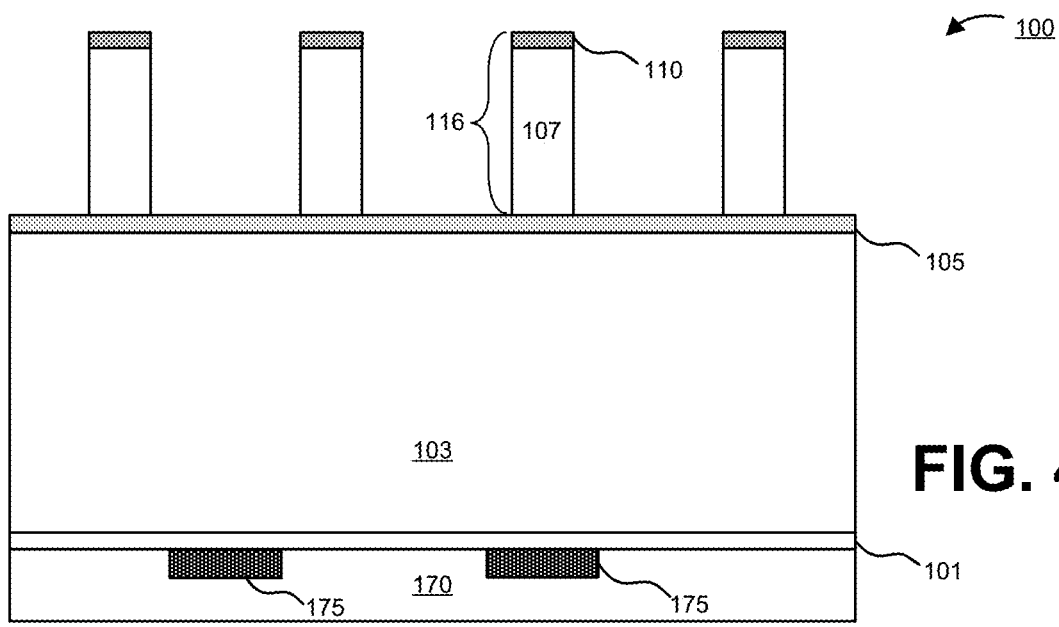
Figure 4F:
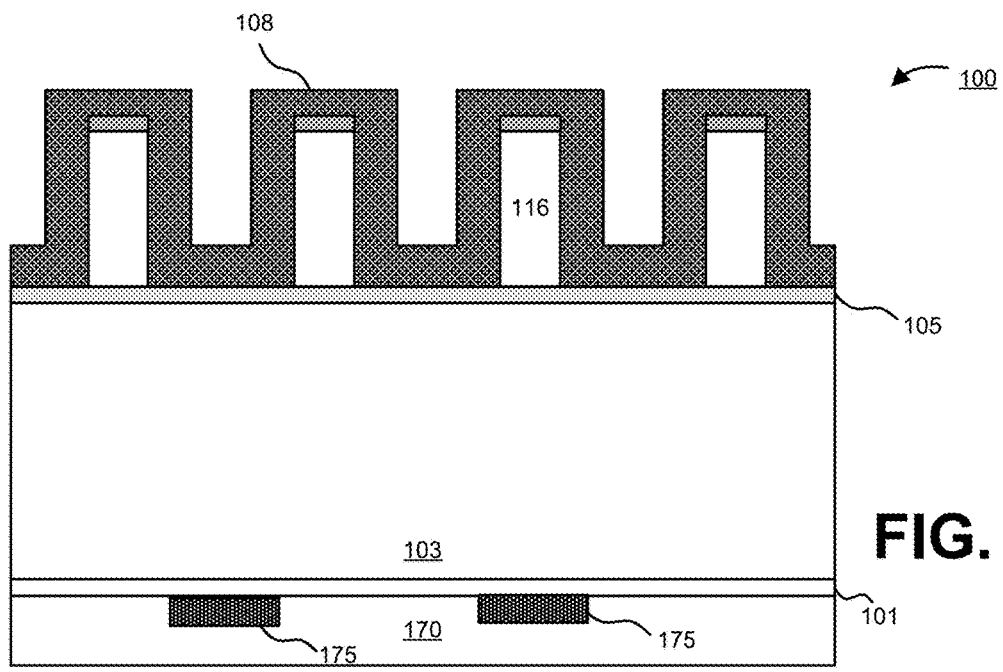
Figure 4G:
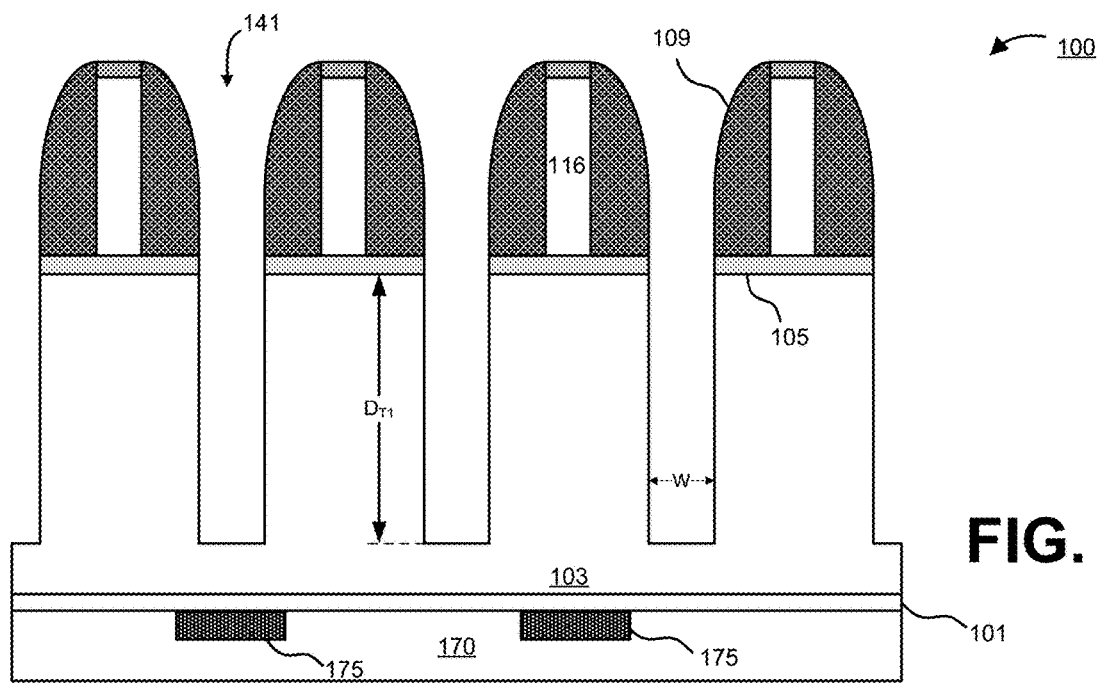
Figure 4H:
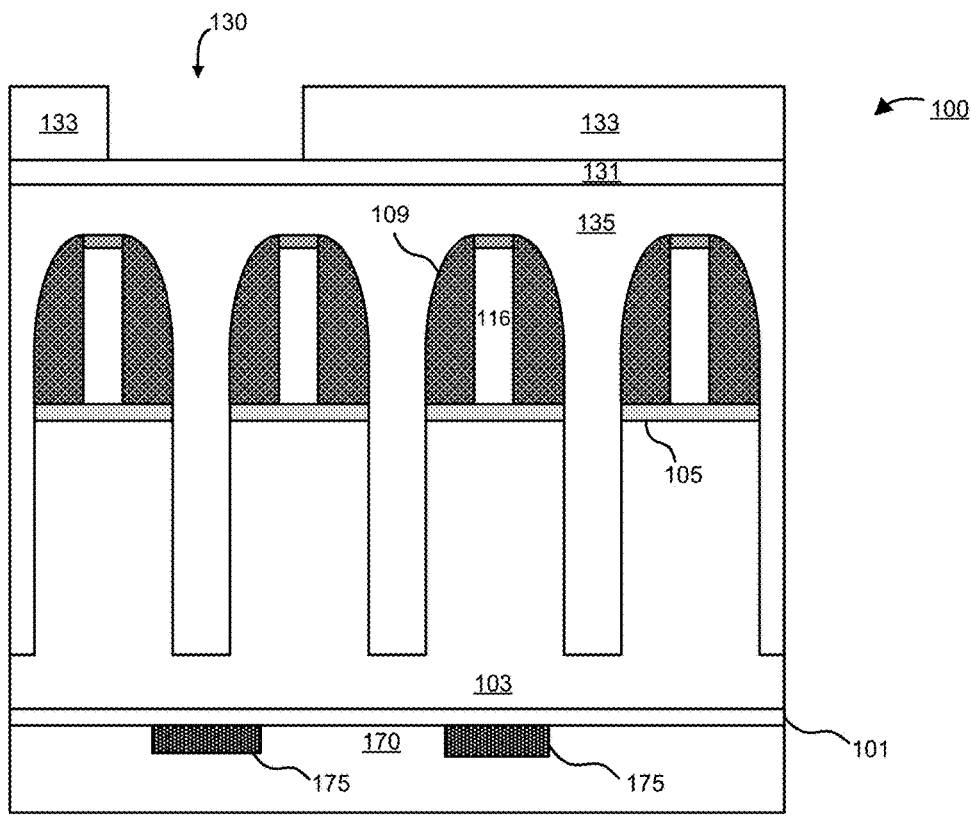
Figure 4I:
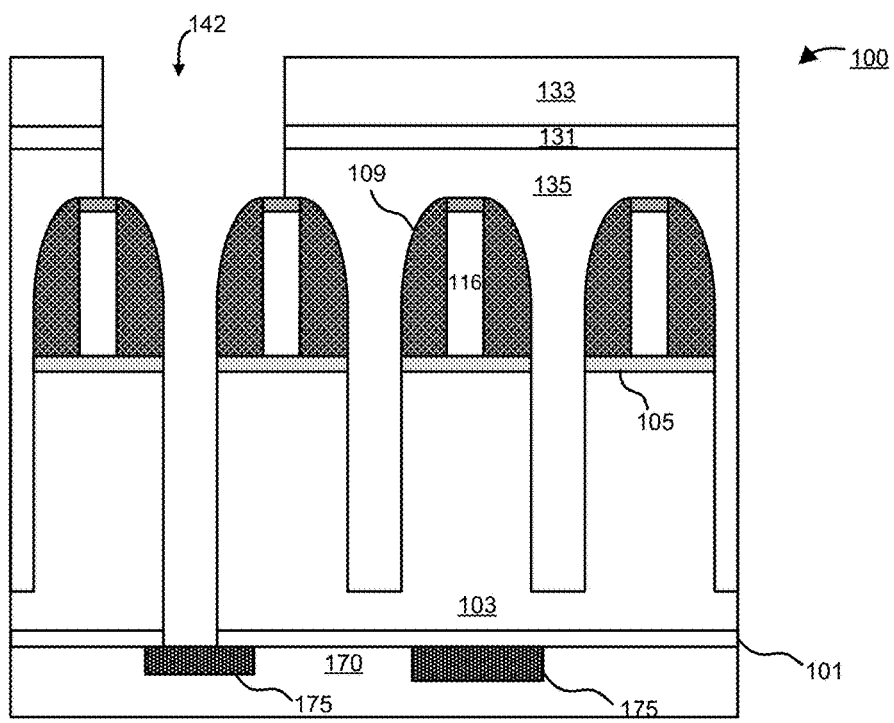
Figure 4J:
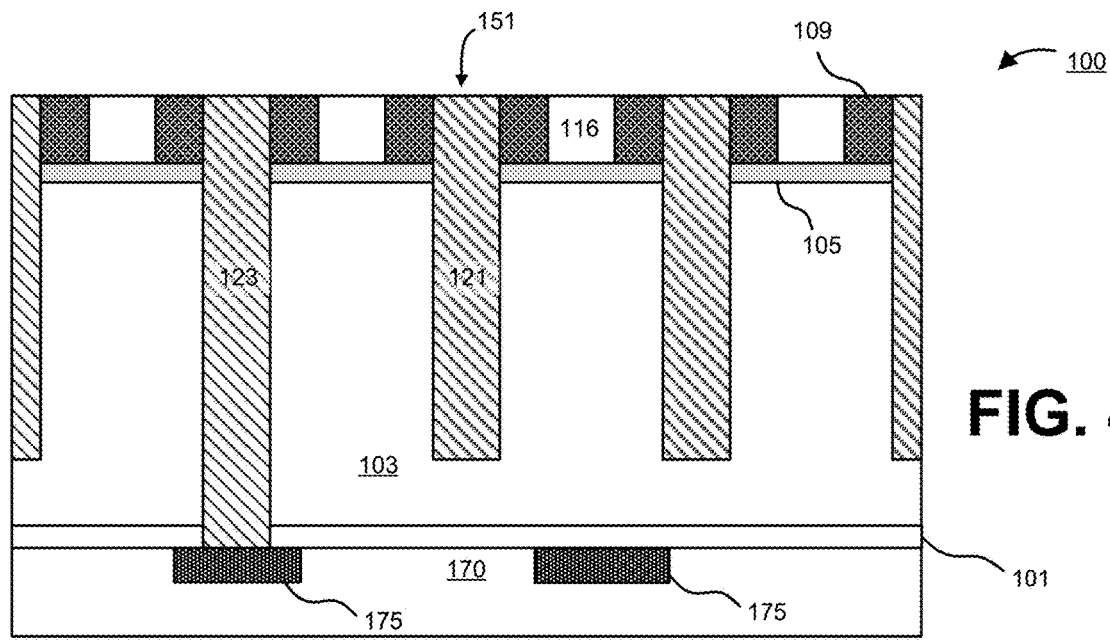
Figure 4K:
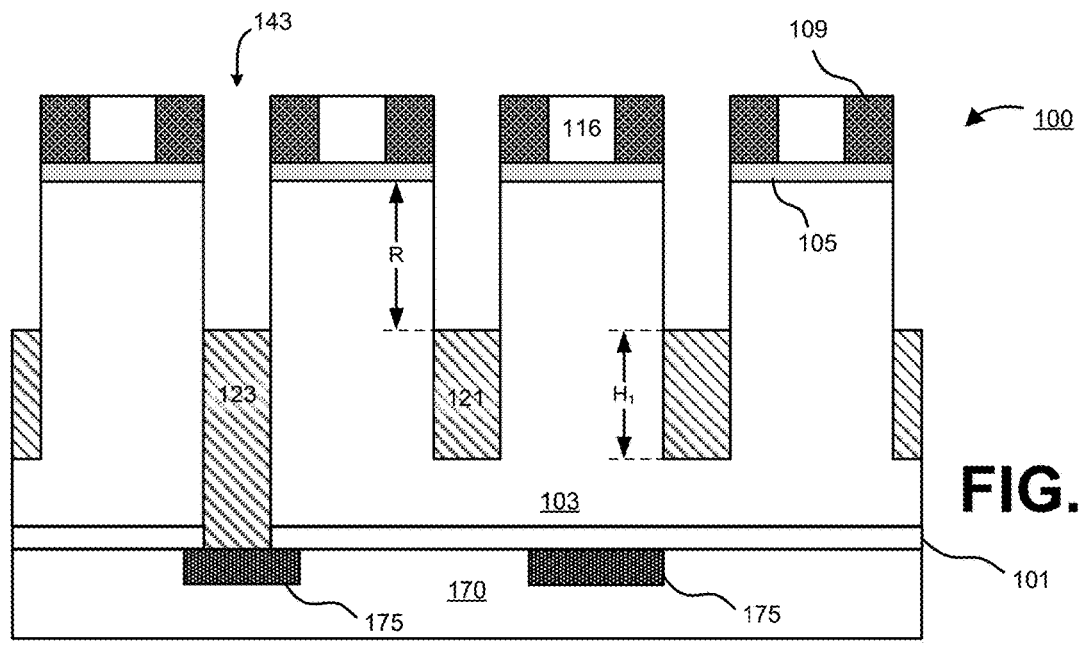
Figure 4L:
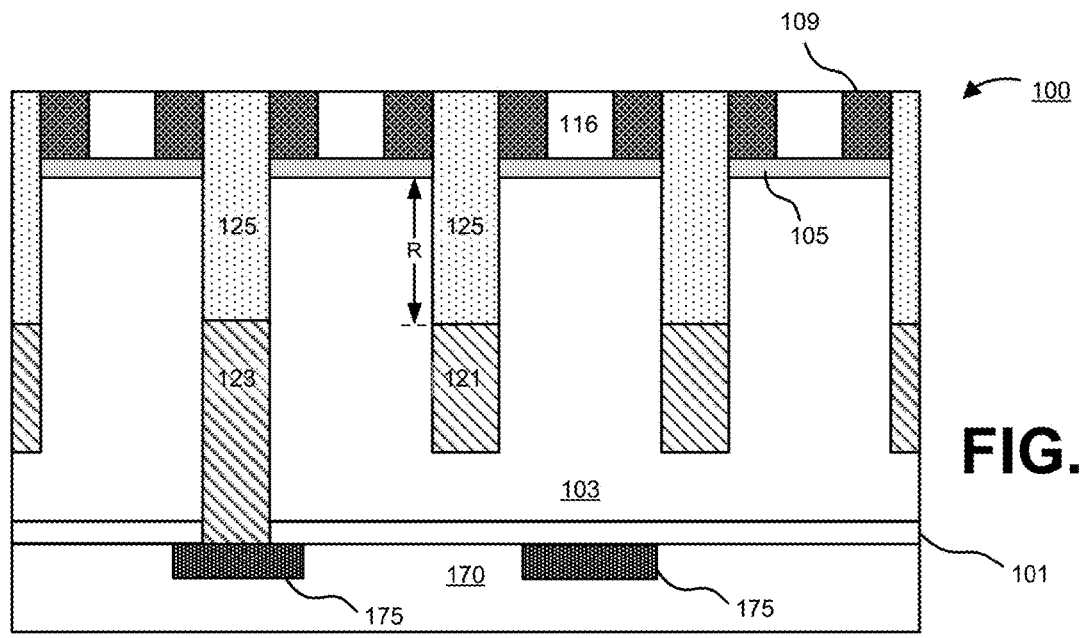
Figure 4M:
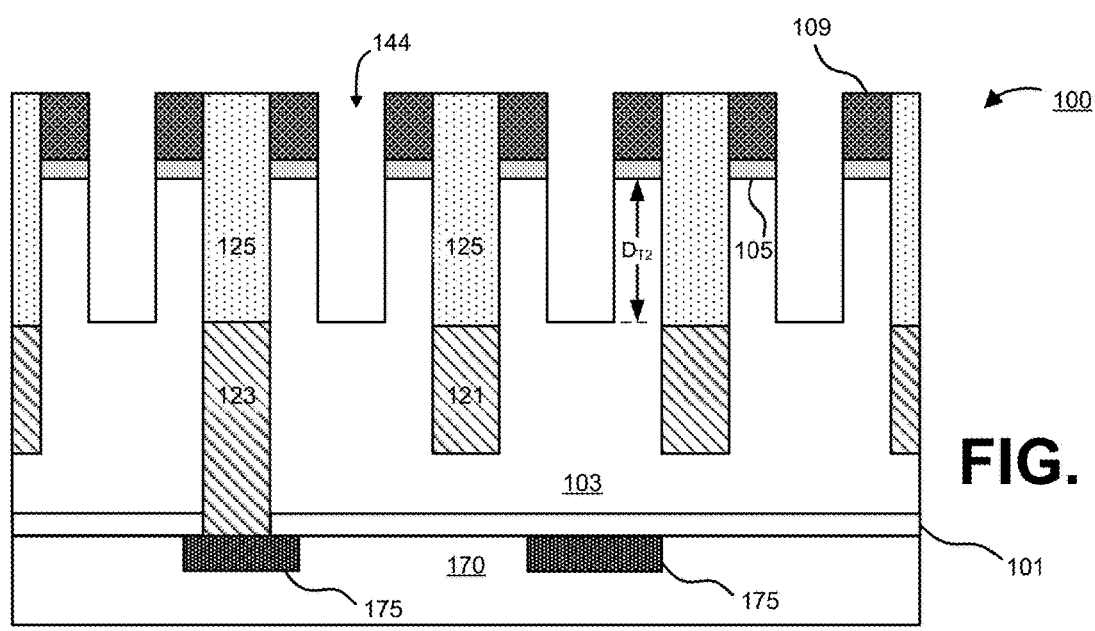
Figure 4N:
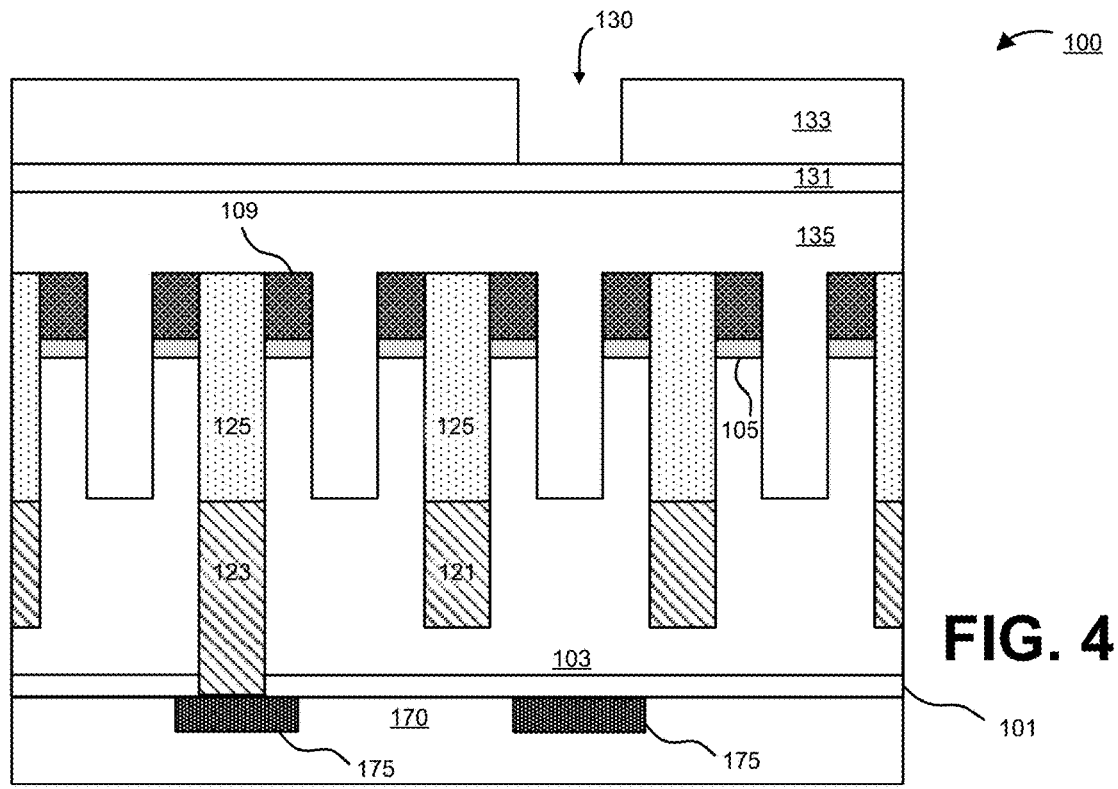
Figure 4O:
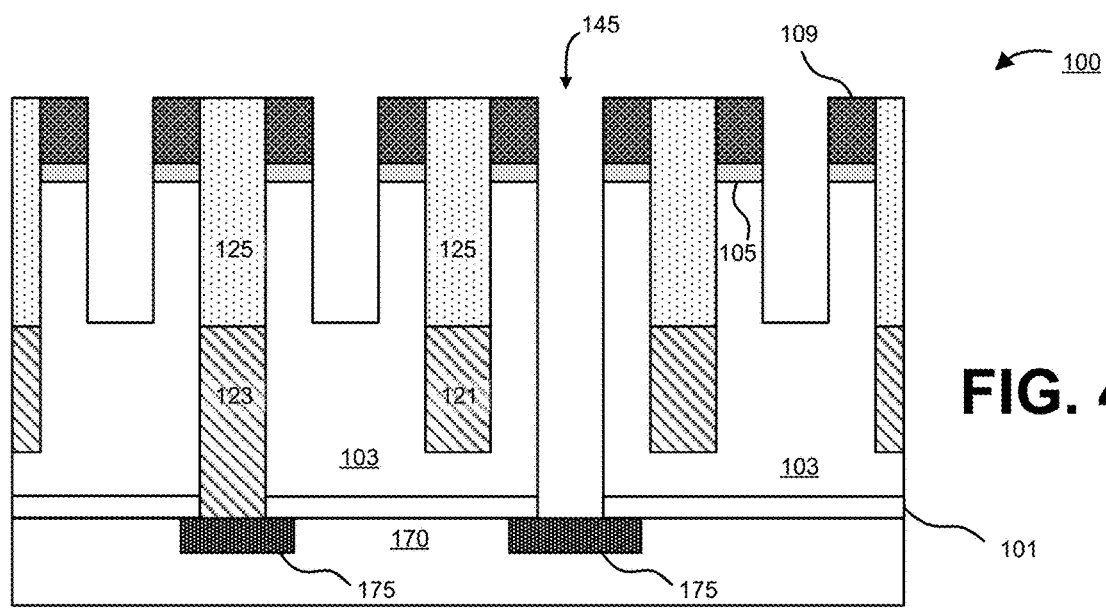
Figure 4P:
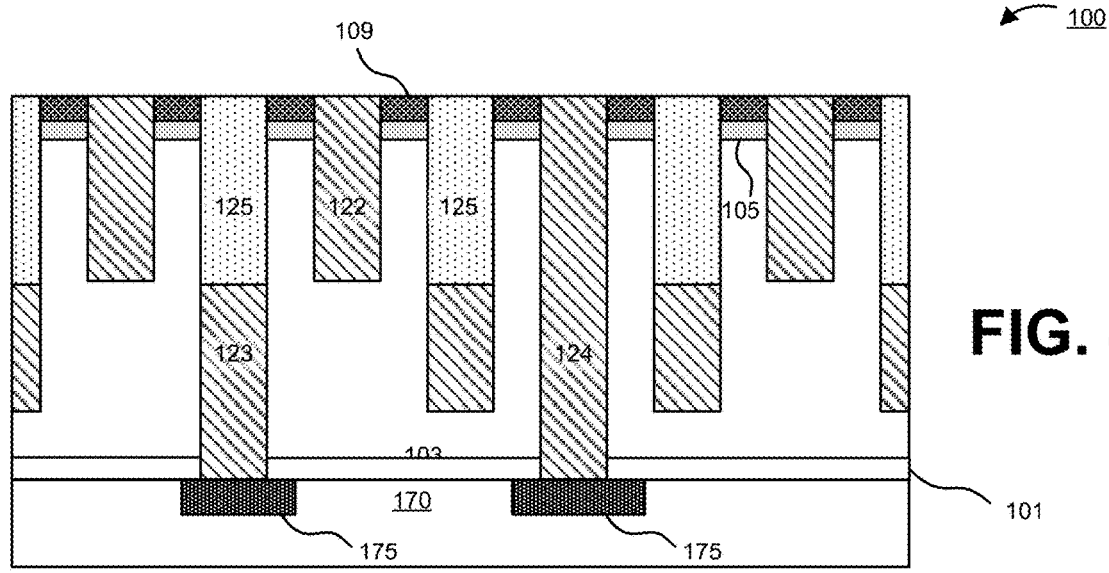
Figure 4Q:
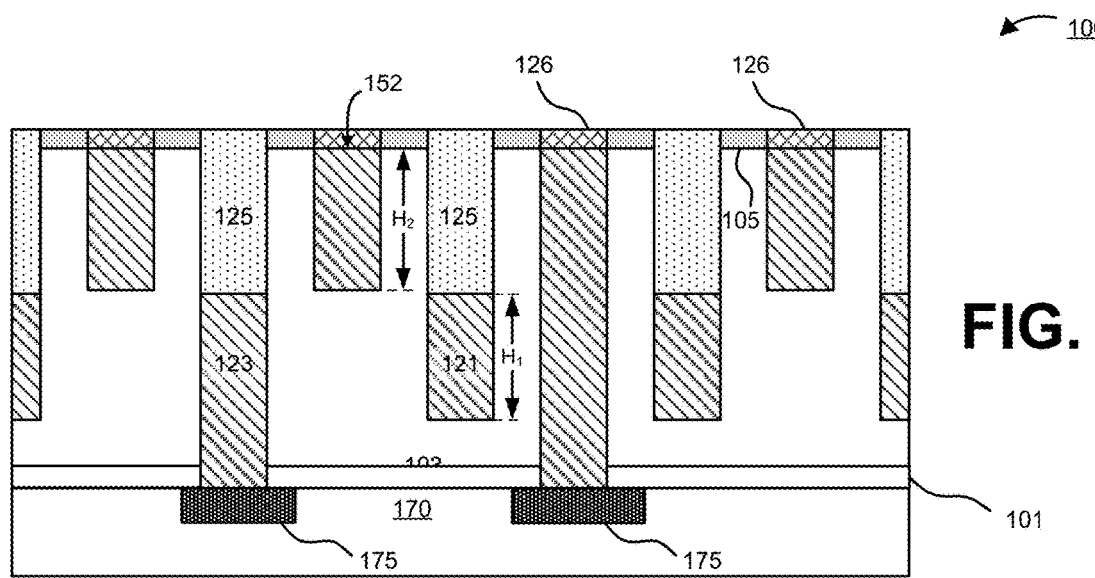

Certain embodiments of the invention may be manufactured according to the processes described with respect to FIGS. 4A-4Q. Referring now to FIG. 4A, the ILD 103 in which the interconnect structure will be formed is shown. According to embodiments of the invention, a masking stack 400 is disposed above the ILD 103. According to embodiments of the invention, the masking stack 400 comprises multiple layers suitable for masking and etching features into the ILD 103. According to an embodiment, the masking stack 400 may comprise an etch-stop layer 105, such as a nitride or an oxide material, disposed over the ILD 103. Masking stack 400 may further comprise a carbon hardmask 107 that is disposed above the etch-stop layer 105. The carbon hardmask 107 may be any material suitable for the formation of a hardmask layer, such as an amorphous silicon or a silicon carbide. A hardmask etch-stop layer 110 may be disposed above the carbon hardmask 107. According to embodiments of the invention, the hardmask etch-stop layer 110 may be an etch resistant material, such as, but not limited to TiO, ZrO, AlN, ZrAlTiO, or AlO. Masking stack 400 may also comprise a dummy hardmask layer 111 that is disposed above the hardmask etch-stop layer 110. According to an embodiment of the invention, the dummy hardmask layer 111 may be any material suitable for the formation of a hardmask layer, such as an amorphous silicon or a silicon carbide. According to an embodiment, the masking stack 400 may further comprise an antireflective layer 112, such as a silicon layer, disposed above the dummy hardmask layer 111. The antireflective layer 112 may be included in the masking stack 400 in order to provide better control of patterning of the mask layer 133 disposed above the antireflective layer 112. According to embodiments of the invention, the mask layer 133 may be a material typically patterned with a lithographic process, such as a photo-sensitive resist. As shown in FIG. 4A, the mask layer 133 has been patterned to form the desired shape for a first structure that will be transferred into the dummy hardmask layer 111. According to embodiments of the invention the ILD 103 may be disposed over an additional layer 170. According to embodiments, layer 170 may be an additional interconnect structure or it may be a device substrate on which electrical circuitry is disposed. As shown in FIG. 4A, two separate pads 175 are disposed in layer 170. By way of example, and not by way of limitation, pads 175 may be conductive lines, S/D contacts of a transistor device, or any other feature of a semiconductor device that requires an electrical connection, such as any region of 170 that is a portion of the interconnect scheme.

Referring now to FIG. 4B, the pattern of the mask layer 133 has been transferred into the dummy hardmask layer 111 to form the first backbones 115. Embodiments of the invention transfer the pattern of the mask layer 133 into the dummy hardmask layer 111 with an etching process, such as wet or dry etching process known in the art. The remaining portions of the antireflective coating 112 and the mask layer 133 have been removed. Next in FIG. 4C, a spacer forming layer 113 is disposed over the first backbones 115 and the exposed portions of the hardmask etch-stop layer 110. The spacer forming layer 113 may be a material typically used for the formation of dielectric spacers, such as an oxide or a nitride. A spacer etching process is then used to form the spacers 114 on each side of the first backbones 115. Embodiments include a spacer etching process that selectively removes the material from the spacer forming layer 113 that is disposed on horizontal surfaces, thereby leaving spacers 114 along the sidewalls of the first backbones 115. Subsequent to the spacer formation, the first backbones 115 are etched away, as shown in FIG. 4D.

Referring now to FIG. 4E, the spacers 114 are used as an etch-mask, and their pattern is transferred into the hard mask layer 107. After the etching process portions of the hard mask layer 107 and the etch-stop layer 110 remain, which together will be referred to as the second backbone 116. Embodiments utilize etching processes known in the art, such as wet or dry etching process, to transfer the pattern of the spacers 114 into the hard mask layer 107.

Referring now to FIG. 4F, the second backbone 116 is then covered with a film 108. The film 108 is material that may be used to form a second spacer material. According to an embodiment, the film 108 may be a hard and conformal material, such as, but not limited to TiO, ZrO, AlN, AlO, and combinations thereof. According to an embodiment of the invention, the material used for the second backbone 116 has a high selectivity over the material used for the second film 108 during an etching process. According to such embodiments, the material forming the film 108 is resistant to an etching process that will readily etch away the backbone 116. By way of example, when the second backbones 116 are made from an amorphous silicon, then film 108 may be made with titanium oxide.

Referring now to FIG. 4G, a spacer etching process has been performed in order to turn film 108 into spacers 109. Embodiments include an anisotropic spacer etching process that selectively removes the material in the film 108 that is disposed on horizontal surfaces, thereby leaving spacers 109 along the sidewalls of the second backbones 116. According to an embodiment, portions of the film 108 may remain above the top surfaces of the second backbones 116, as shown in FIG. 4G. Thereafter, a first trench etching process is used to form first trenches 141 through the etch-stop layer 105 and into the ILD 103. The first trench etching process utilizes the spacers 109 as a mask in order to provide the proper spacing between the first trenches 141 and to be formed with the desired width W. According to an embodiment of the invention, the width W is less than 30 nm. An additional embodiment of the invention includes a width W that is less than 15 nm. According to an embodiment, the trenches are formed to a depth $D_{T1}$ from the top surface of the ILD 103. Embodiments of the invention include forming the first trenches 141 with a depth $D_{T1}$ between 20 nm and 60 nm. Additional embodiments of the invention include forming the first trenches 141 to a depth $D_{T1}$ of approximately 40 nm.

Referring now to FIG. 4H a through via masking process may be implemented according to an embodiment of the invention. A carbon hard mask 135 is disposed into the trenches 141 and above the spacers 109. An antireflective coating 131, such as amorphous silicon, may be disposed over the carbon hardmask 135. A via mask 133, such as a photoresist, is disposed and patterned to have a mask opening 130 formed above one of the first trenches 141, as shown in FIG. 4H. Referring now to FIG. 4I, the carbon hardmask 135 underneath the mask opening 130 is then etched away. The etching process also etches through portions of the ILD 103 underneath the bottom of the first trench 141 and through the bottom etch-stop layer 101 to form through via 142. Through via 142 may provide a connection to layers or features below ILD 103, such as layer 170 and pad 175. While a single through via 142 is shown, embodiments may also include interconnect structures 100 with more than one through via 142.

Referring now to FIG. 4J, the remaining carbon hard mask 135, antireflective coating 131 and masking material 133 are removed. According to an embodiment metal is disposed into the first trenches 141 to form the first interconnect lines 121 and into the through via 142 to form the first through via 123. Though not shown in FIG. 4J, embodiments of the invention may also include barrier layers and/or adhesion layers such as, but not limited to, TaN+Ta, Ta, TaN, Ti, TiN, WN, or MnN, as is well known to those skilled in the art. According to embodiments of the invention, the metal may be any conductive metal used for interconnect lines, such as copper, cobalt, or tungsten. Embodiments include disposing the first metal into the first trenches 141 and the through via 142 with a deposition process known in the art, such as, but not limited to, chemical vapor deposition (CVD), atomic layer deposition (ALD), or electroplating. As shown in FIG. 4J, the top surfaces 151 of the first interconnects 121 have been planarized with the top surfaces of the spacers 109 in order to remove overflow material from the metal deposition. According to an embodiment, the planarization may be performed with a process such as chemical-mechanical planarization (CMP) or an etching process. Additional embodiments of the invention include utilizing the planarization process to remove an upper portion of the spacers 109 and exposes the a top surfaces of the second backbones 116, as shown in FIG. 4J.

Referring now to FIG. 4K, the first interconnect lines 121 and the first through via 123 are recessed back a depth R to form the recesses 143. According to embodiments of the invention, the depth R may be chosen such that the top surfaces of the first interconnect lines 121 and the first through via 123 are recessed a desired distance into the ILD 103. According to an embodiment the depth R of the recesses 143 may be 10 nm or greater. According to an additional embodiment, the depth R of the recesses 143 may be 15 nm or greater. According to embodiments of the invention that utilize copper as the interconnect metal, the etching process is a wet etching process. According to embodiments of the invention that utilize metals besides copper, such as cobalt or tungsten, the etching process may be a wet or dry etching process. After the recess 143 is formed, the first interconnects 121 are a first height $H_1$. Embodiments of the invention include first interconnects 121 with a first height between 10 nm and 30 nm. According to embodiments, the first height $H_1$ may be between 15 nm and 25 nm.

Referring now to FIG. 4L, first dielectric caps 125 are disposed into the first recesses 143. According to embodiments of the invention the first dielectric caps may then be polished level with the top surfaces of the spacers 109, as shown in FIG. 4L. According to embodiments of the invention, the first dielectric caps 125 may be deposited with methods such as chemical vapor deposition (CVD), atomic layer deposition (ALD), or physical vapor deposition (PVD). The polishing process used for the dielectric caps 125 may be a CMP process. Embodiments of the invention may utilize a material such as $SiO_xC_yN_z$, non-conductive metal oxides, or metal nitrides for the first dielectric caps 125. Additional embodiments of the invention may select a material for the first dielectric caps 125 that has a high etch selectivity over the etch-stop layer 105 and over the second dielectric caps 126 during an etching process.

Referring now to FIG. 4M, the second backbones 116 are etched away. According to an embodiment, the remaining portions of the spacers 109 provide a masking layer for use in etching the second trenches 144 that are formed into portions of the ILD 103 that were previously located underneath the second backbones. Embodiments of the invention include etching the second trenches 144 to a depth $D_{T2}$ into the ILD 103. Embodiments of the invention include depths $D_{T2}$ that are between 10 nm and 30 nm. According to an embodiment of the invention, $D_{T2}$ is approximately 15 nm. While $D_{T2}$ is shown as being equal to recess R, embodiments of the invention are not so limited. According to additional embodiments, the second depth $D_{T2}$ may be less than recess R. Alternative embodiments include a second depth $D_{T2}$ that is greater than recess R, as shown in the embodiment depicted in FIG. 2B.

Referring now to FIG. 4N, a second through via patterning process is implemented for making an electrical connection to a lower layer 170, according to an embodiment of the invention. A carbon hard mask 135 is disposed into the second trenches 144 and above the spacers 109. An antireflective coating 131, such as silicon, may be disposed over the carbon hardmask 135. A via mask 133, such as a photosensitive resist or other masking materials, is disposed and patterned to have a mask opening 130 formed above one of the second trenches 144. Referring now to FIG. 4O, the carbon hardmask 135 underneath the mask opening 130 and the portion of the ILD 103 and the bottom etch-stop layer 101 underneath the second trench 144 are etched away to form through via 145. Through via 145 may provide a connection to layers or features below ILD 103, such as layer 170 and pad 175. After the through via 145 is formed, the remaining carbon hard mask 135, antireflective coating 131 and masking material 133 are removed.

Referring now to FIG. 4P, a conductive material is disposed into second trenches 144 and second through via trench 145 to form the second interconnect lines 122 and the second through via 124. Though not shown in FIG. 4P, embodiments of the invention may also include barrier layers and/or adhesion layers such as, but not limited to, TaN+Ta, Ta, TaN, Ti, TiN, WN, or MnN, as is well known to those skilled in the art. According to an embodiment, the metal disposed into the trenches may be the same metal used to form the first interconnect lines, or it may be a different metal suitable for the formation of conductive interconnect lines. According to embodiments, after the deposition of the conductive material, the top layer is polished back to remove excess metal that may have been disposed outside of the second trenches 144 and through via trench 145, with a process such as CMP or an etching process. In embodiments of the invention portions of the spacers 109 may be polished down during the polishing process.

Thereafter, in FIG. 4Q the second interconnect lines 122 may be recessed below the etch-stop layer 105 according to an embodiment of the invention. According to an embodiment, the recess may result in the top surfaces 152 being disposed below the top surface of the etch stop layer 105. According to an additional embodiment, the top surfaces 152 are substantially coplanar with the top surface of the ILD 103, or recessed below the top surface of the ILD 103. Embodiments include recessing the second interconnect lines 122 with a wet or dry etching process. According to the embodiment shown in FIG. 4Q, the height $H_2$ of the second interconnects may be the same height $H^1$ as the first interconnect lines 121. According to alternative embodiments the height $H_2$ of the second interconnect lines 122 may be larger or smaller than the height $H_1$ of the first interconnect lines 121. Subsequent to the recessing process, second dielectric caps 126 may be disposed above the second interconnects 122 and the second through via 124. The second dielectric caps 126 may be deposited with methods such as CVD, ALD, or PVD. Embodiments of the invention may include a material such as $SiO_xC_yN_z$, non-conductive metal oxides, or metal nitrides for the second dielectric caps 126. Additional embodiments of the invention may include a material for the second caps 126 that has a high etch selectivity over the etch-stop layer 105 and to the first dielectric caps 125. Once the second dielectric caps 126 have been formed, additional dielectric material may be polished back with a chemical mechanical planarization process or an etching process. The planarization process may also polish away the remaining portions of the spacers 109 in order to leave only the top surface of the etch-stop layer 105 and the top surfaces of the first and second caps 125, 126 exposed.

According to an additional embodiment, the spacers 109 may be completely polished back during the polishing process used to remove the excess conductive material disposed in the second trenches to form the second interconnect lines 122. Thereafter, the second interconnect lines may be recessed and filled with a dielectric material to form the second dielectric caps 126 as described above.

Alternative embodiments may forego recessing the second interconnect lines 122 when etch selectivity is not needed to make contacts to individual interconnect lines. For example, etch selectivity may not be needed when the pitch between interconnect lines is large enough that misaligned contact openings will not overlap a neighboring interconnect line. According to such embodiments, an etch-stop layer may be disposed over the top surface of the second interconnect lines 122 and the top surface of the exposed etchstop layer 105.

Figure 5A:
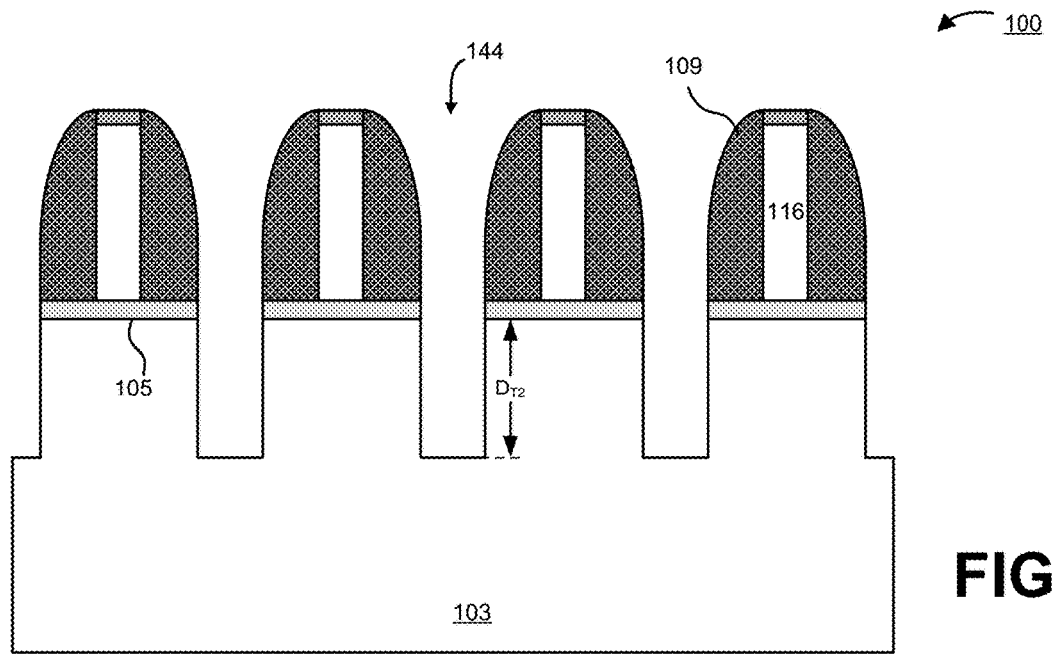
FIGS. 5A-5F illustrate a processing flow for forming low capacitance interconnect structures according to embodiments of the invention.

According to an additional embodiment of the invention, the first and second interconnect lines 121, 122 may be formed in reverse order (i.e., the recessed first interconnect lines 121 may be formed subsequent to the formation of the second interconnect lines 122). Certain embodiments of the invention in which the second interconnect lines 122 are formed prior to the formation of the first interconnect lines 121 may be manufactured according to the processes described with respect to FIGS. 5A-5G. A method of forming the low capacitance interconnect structure 100 according to this embodiment of the invention comprises initial processing similar to those described with respect to FIGS. 4A-4F, and therefore will not be repeated here. Accordingly, FIG. 5A illustrates processing of the interconnect structure 100 following the formation of the spacer film 108 shown in FIG. 4F. Additionally, though not shown in FIGS. 5A-5F, those skilled in the art will recognize that first and second through vias may also be included in an interconnect structure 100 formed in accordance with embodiments of the invention. According to such embodiments, masking and etching processes substantially similar to those described with respect to FIGS. 4H-4I, and 4N-4O may be implemented in order to produce through vias 121 and 123 as desired.

Referring now to FIG. 5A, a spacer etch is implemented to form spacers 109 that are substantially similar to the spacers 109 formed in FIG. 4G. Embodiments of the invention then utilize a second etching process in order to form the second trenches 144. Embodiments of the invention include etching the second trenches 144 to a depth $D_{T2}$ into the ILD 103. Embodiments of the invention include depths $D_{T2}$ that are between 10 nm and 30 nm. According to an embodiment of the invention, $D_{T2}$ is approximately 15 nm.

Figure 5B:
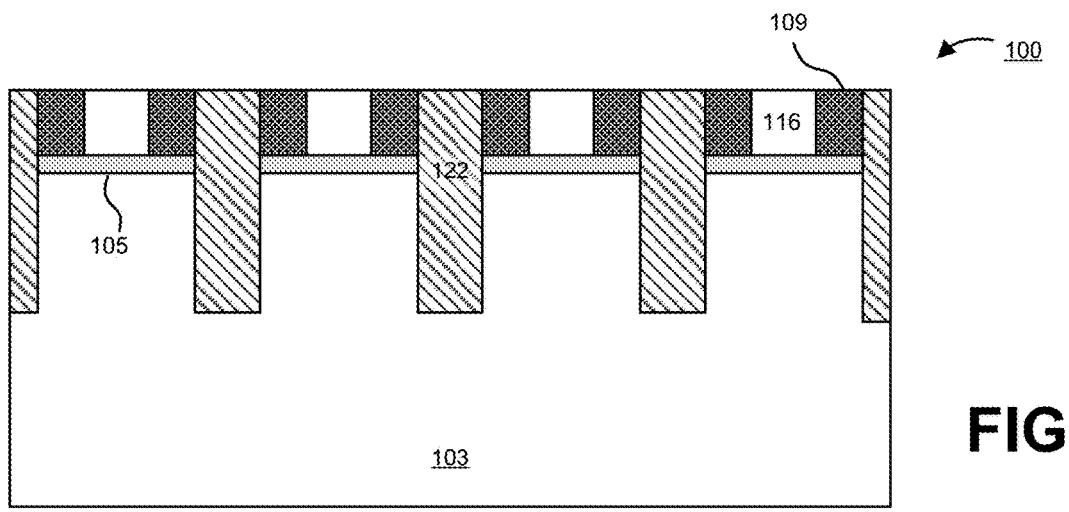

After the second trenches 144 have been formed, the trenches are filled with a conductive material to form the second interconnect lines 122, as shown in FIG. 5B. According to embodiments of the invention, the metal may be any conductive metal used for interconnect lines, such as copper, cobalt, or tungsten. Embodiments include disposing the metal into the second trenches 144 with a deposition process known in the art, such as CVD. In an embodiment, the overburden is polished back with a polishing process, such as CMP or an etching process. Additional embodiments of the invention utilize the planarization process to remove an upper portion of the spacers 109 and expose top surfaces of the second backbones 116.

Figure 5C:
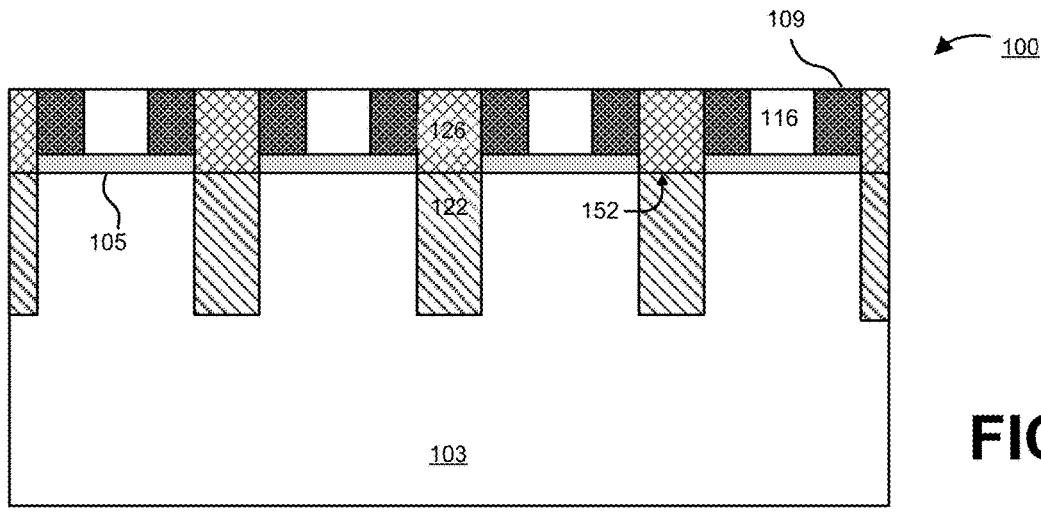

Referring now to FIG. 5C, the second interconnect lines 122 are recessed below the etch-stop layer 105. According to an embodiment, the top surfaces 142 of the second interconnect lines 122 are recessed such that they are substantially coplanar with the top surface of the ILD 103. According to additional embodiments, the top surfaces 142 second interconnect lines 122 may be recessed below the top surface of the ILD 103. Embodiments include recessing the second interconnect lines 122 with a wet or dry etching process. Subsequent to the recessing process, second dielectric caps 126 may be disposed above the second interconnects 122. The second dielectric caps 126 may be deposited with methods such as CVD, ALD, or PVD. Embodiments of the invention have second dielectric caps 126 that are made of a material such as $SiO_xC_yN_z$, metal oxides, or metal nitrides. Additional embodiments of the invention may have second dielectric caps 126 that have a high selectivity over the etch-stop layer 105 and to the first dielectric caps 125 during an etching process. Once the second dielectric caps 126 have been formed, additional dielectric material may be polished back. According to an embodiment, the second dielectric caps 126 are polished back such that they are substantially coplanar with the top surfaces of the spacers 109. According to an embodiment the polishing process may be implement with a CMP process or an etching process.

Figure 5D:
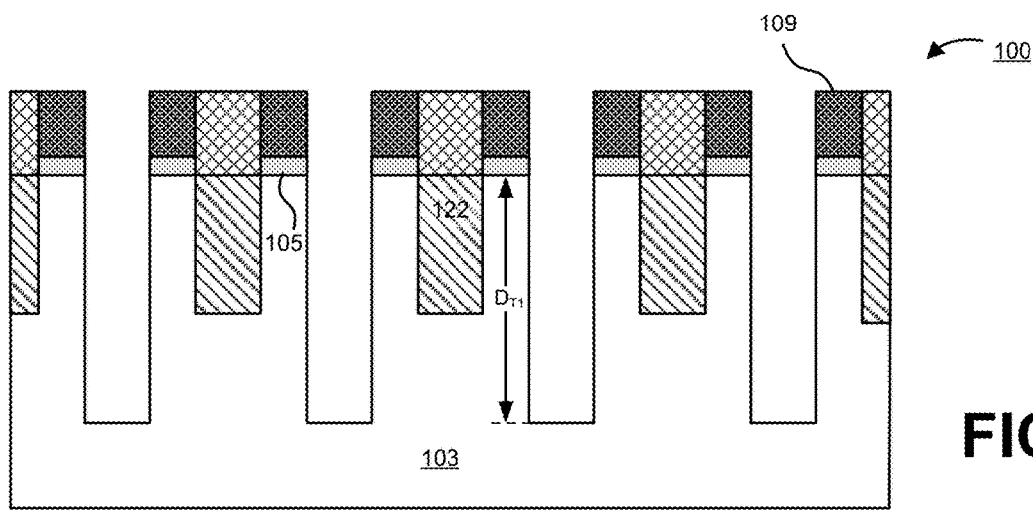
Figure 5E:
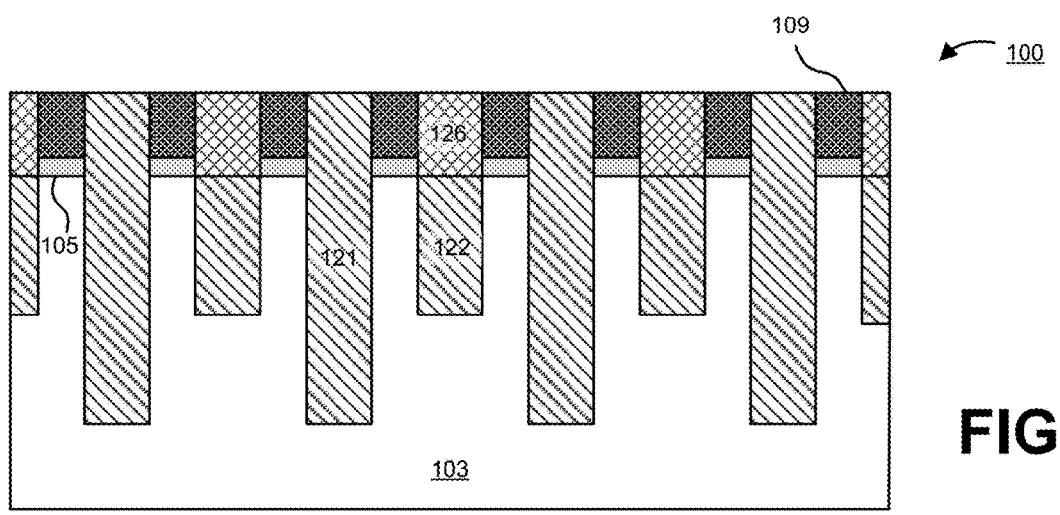

Referring now to FIG. 5D the second backbones 116 are etched away and the first trenches 141 are formed into the ILD 103 with a trench etching process. According to an embodiment, the trenches are formed to a depth $D_{T1}$. Embodiments of the invention have first trenches 141 with a depth $D_{T1}$ between 20 nm and 60 nm. Additional embodiments of the invention include forming the first trenches 141 with a depth $D_{T1}$ of approximately 40 nm. First trenches 141 are then filled with a conductive material to form the first interconnect lines 121, as shown in FIG. 5E. According to embodiments of the invention, the conductive material may be any conductive metal used for interconnect lines, such as copper, cobalt, or tungsten. Embodiments include disposing the first metal into the first trenches with a deposition process known in the art, such as CVD. In an embodiment, the overburden is polished back with a polishing process, such as CMP or an etching process.

Figure 5F:
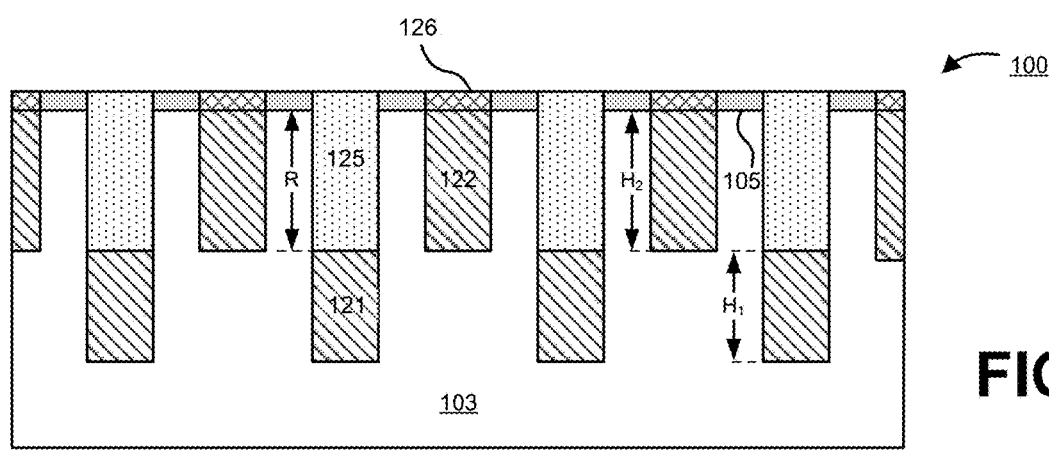

Thereafter the first interconnect lines 121 may be recessed a depth R into the ILD 103, as shown in FIG. 5F. Embodiments may use a wet or dry etching process to recess the first interconnect lines 121. First dielectric caps 125 may then be disposed above the recessed first interconnect lines 121. According to embodiments, the first dielectric caps may be deposited with methods such as CVD, ALD, or PVD. Embodiments of the invention have first dielectric caps 125 that are made of a material such as $SiO_xC_yN_z$, non-conductive metal oxides, or metal nitrides for the first dielectric caps 125. Additional embodiments of the invention have first dielectric caps 125 that have a high selectivity over the etch-stop layer 105 and to the second dielectric caps 126 during an etching process. After the first dielectric caps 125 have been formed, additional dielectric material may be polished back with a CMP process or an etching process, such that the first dielectric caps are substantially coplanar with the top surface of the spacers 109. According to an embodiment, the polishing process used to remove the excess dielectric material may also remove the remaining portions of the spacers 109.

Figure 6:
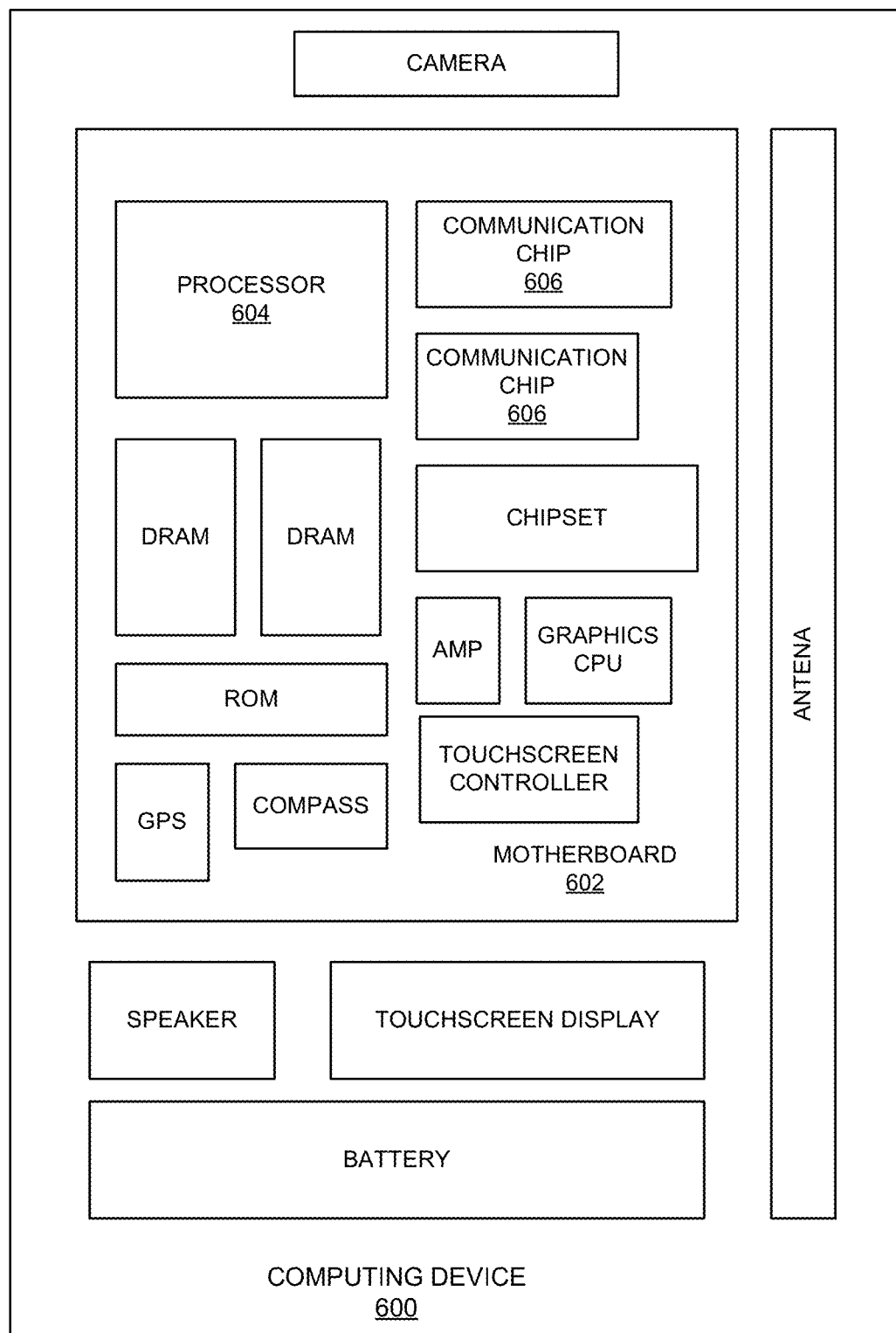
FIG. 6 illustrates a schematic diagram of a computing device that utilizes a low capacitance interconnect structure in accordance with an embodiment of the invention

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as devices that include a low capacitance interconnect structure built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as devices including a low capacitance interconnect structure built in accordance with implementations of the invention.

In further implementations, another component housed within the computing device 600 may contain an integrated circuit die that includes one or more devices, such as devices including a low capacitance interconnect structure built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments of the invention include, an interconnect structure comprising, an interlayer dielectric (ILD), one or more first interconnect lines disposed in the ILD, wherein a first dielectric cap is disposed above a top surface of each of the first interconnect lines, and one or more second interconnect lines disposed into the ILD in an alternating pattern with the first interconnect lines, wherein a second dielectric cap is disposed above a top surface of each of the second interconnect lines, and wherein the top surfaces of the first interconnect lines are recessed into the ILD deeper than the top surfaces of the second interconnect lines. An additional embodiment includes and interconnect structure wherein the first dielectric caps are a different material than the second dielectric caps. An additional embodiment includes an interconnect structure wherein the first dielectric caps are resistant to an etching process that is selective to the second dielectric caps. An additional embodiment includes an interconnect structure, wherein the first dielectric caps and the second dielectric caps are resistant to an etching process that is selective to an etch-stop layer disposed above the ILD. An additional embodiment includes an interconnect structure wherein the top surfaces of the first interconnect lines are disposed deeper into the ILD than bottom surfaces of the second interconnect lines. An additional embodiment includes an interconnect structure, wherein bottom surfaces of the second interconnect lines are disposed deeper into the ILD than the top surfaces of the first interconnect lines. An additional embodiment includes an interconnect structure further comprising one or more first through vias formed through the ILD, wherein top surfaces of the first through vias are recessed the same depth into the ILD as the top surfaces of the first interconnect lines, and a first dielectric cap is disposed on the top surfaces of the first through vias.

An additional embodiment includes an interconnect structure further comprising one or more second through vias formed through the ILD, wherein a second dielectric cap is disposed on the top surfaces of the second through vias. An additional embodiment includes an interconnect structure wherein the first and second caps are a $SiO_xC_yN_z$ material, a metal oxide material, or a metal nitride material. An additional embodiment includes an interconnect structure, wherein the first interconnect lines are spaced less than 25 nm from the second interconnect lines. An additional embodiment includes an interconnect structure, wherein the first interconnect lines have a first height and the second interconnect lines have a second height. An additional embodiment includes an interconnect structure, wherein the first height is larger than the second height.

An embodiment of the invention includes, a method of forming interconnects comprising, forming one or more first trenches into an interlayer dielectric (ILD), disposing a first metal into the one or more first trenches to form first interconnect lines, forming first dielectric caps above top surfaces of the first interconnect lines, forming one or more second trenches into the ILD in an alternating pattern with the first trenches, disposing a second metal into the one or more second trenches to form second interconnect lines, wherein the top surfaces of the first interconnect lines are recessed deeper into the ILD than top surfaces of the second interconnect lines, and forming second dielectric caps on the top surface of the second interconnects. An additional embodiment includes a method of forming interconnects wherein forming the first trenches comprises forming a hardmask above an etch-stop layer disposed over the ILD, forming spacers on the sidewalls of the hardmask, wherein a portion of the etch-stop layer remains exposed between the spacers, and etching through the exposed portions of the etch-stop layer and into the ILD underneath the exposed portions of the etch-stop layer. An additional embodiment includes a method of forming interconnects wherein forming the second trench comprises etching through the hardmask, and etching through portions of the etch-stop layer and into the ILD that were previously disposed underneath the hardmask. An additional embodiment includes a method of forming interconnects further comprising etching through portions of the ILD disposed underneath one or more of the first trenches prior to disposing the first metal into the first trenches. An additional embodiment includes a method of forming interconnects, further comprising etching through portions of the ILD underneath one or more of the second trenches prior to disposing the second metal into the second trenches. An additional embodiment includes a method of forming interconnects wherein the first dielectric caps are resistant to an etching process that is selective to the second dielectric caps. An additional embodiment includes a method of forming interconnects wherein the top surfaces of the first interconnect lines are disposed deeper into the ILD than below bottom surfaces of the second interconnect lines. An additional embodiment includes a method of forming interconnects wherein bottom surfaces of the second interconnect lines are disposed deeper into the ILD than the top surfaces of the first interconnect lines. An additional embodiment includes a method of forming interconnects wherein the first interconnect lines are spaced apart from the second interconnect lines by less than 25 nm. An additional embodiment includes a method of forming interconnects wherein the first and second caps are a SiOxCyNz material, a metal oxide material, or a metal nitride material.

An embodiment of the invention includes a method of forming interconnects comprising, forming and etch-stop layer above an interlayer dielectric (ILD), forming a patterned hardmask above the etch-stop layer, forming a spacer layer over the surfaces of the patterned hardmask and the exposed portions of the etch-stop layer, etching through the spacer layer to form hardmask spacers along the sidewalls of the patterned hardmask, etching through the etch-stop layer and the dielectric layer to form first trenches defined by the hardmask spacers, disposing a first metal into the first trenches to form first interconnect lines in the first trenches, disposing a first cap above each of the first interconnect lines, etching through the patterned hardmask, and the portions of the etch-stop layer and the ILD underneath the patterned hardmask to form second trenches, disposing a second metal into the second trenches to form second interconnect lines in the second trenches, wherein the top surfaces of the first interconnect lines are recessed deeper into the ILD than the top surfaces of the second interconnect lines, disposing a second dielectric cap above each of the second interconnects. An additional embodiment includes a method of forming interconnects wherein the top surfaces of the first interconnect lines are recessed below the bottom surfaces of the second interconnect lines. An additional embodiment includes a method of forming interconnects wherein bottom surfaces of the second interconnect lines are disposed deeper into the ILD than the top surfaces of the first interconnect lines.

What is claimed is:

1. An integrated circuit structure, comprising:
   a transistor device, the transistor device having a source/drain contact;
   a first interconnect line above but not over the source/drain contact, the first interconnect line having a bottom surface and an uppermost surface;
   a second interconnect line above and over the source/drain contact, the second interconnect line above but not over the first interconnect line;
   a through via structure directly electrically connecting the second interconnect line to the source/drain contact, the through via structure laterally adjacent to but not in contact with the first interconnect line, the through via structure comprising a conductive barrier layer continuous from the second interconnect line to the source/drain contact, and the through via structure comprising a conductive fill material within the conductive barrier layer, the conductive fill material continuous from the second interconnect line to the source/drain contact, the through via structure having substantially straight sidewalls from the second interconnect line to the source/drain contact, and the through via structure having an uppermost surface above the uppermost surface of the first interconnect line, wherein the source/drain contact extends laterally beyond the sidewalls of the through via structure;
   a first dielectric material portion below the first interconnect line and above the transistor device, the first dielectric material portion laterally adjacent to the through via structure;
   a second dielectric material portion laterally between the through via structure and the first interconnect line; and
   a third dielectric material portion over and in contact with the first interconnect line, wherein the third dielectric material portion, the second dielectric material portion and the first dielectric material portion are continuous with one another.

2. The integrated circuit structure of claim 1, wherein the second dielectric material portion is discrete from the third dielectric material portion.

3. The integrated circuit structure of claim 1, wherein the first dielectric material portion and the second dielectric material portion comprise a low-k dielectric material.

4. The integrated circuit structure of claim 3, wherein the low-k dielectric material selected from the group consisting of carbon doped silicon dioxide, porous silicon dioxide.

5. The integrated circuit structure of claim 1, wherein the third dielectric material portion comprises $SiO_xC_yN_z$.

6. The integrated circuit structure of claim 1, wherein the first interconnect line and the through via structure are spaced apart by a pitch, and wherein the pitch is less than 60 nanometers.

7. The integrated circuit structure of claim 1, wherein the through via structure has a width less than 30 nanometers.

8. The integrated circuit structure of claim 1, wherein the first interconnect line and the through via structure have a same metal composition.

9. The integrated circuit structure of claim 1, wherein the first interconnect line and the through via structure have a different metal composition.

10. The integrated circuit structure of claim 1, wherein the through via structure comprises copper.

11. An integrated circuit structure, comprising:
    a transistor device, the transistor device having a source/drain contact;
    a first interconnect line above but not over the source/drain contact, the first interconnect line having a bottom surface and an uppermost surface;
    a second interconnect line above and over the source/drain contact, the second interconnect line above but not over the first interconnect line;
    a through via structure directly electrically connecting the second interconnect line to the source/drain contact, the through via structure comprising a conductive barrier layer continuous from the second interconnect line to the source/drain contact, and the through via structure comprising a conductive fill material within the conductive barrier layer, the conductive fill material continuous from the second interconnect line to the source/drain contact, the through via structure having substantially straight sidewalls from the second interconnect line to the source/drain contact, and the through via structure having an uppermost surface above the uppermost surface of the first interconnect line, wherein the source/drain contact extends laterally beyond the sidewalls of the through via structure;

a first dielectric material portion below the first interconnect line and above the transistor device, the first dielectric material portion laterally adjacent to the through via structure;

a second dielectric material portion laterally between the through via structure and the first interconnect line; and a third dielectric material portion over and in contact with the first interconnect line, wherein the third dielectric material portion, the second dielectric material portion and the first dielectric material portion are continuous with one another.

12. The integrated circuit structure of claim 11, wherein the second dielectric material portion is discrete from the third dielectric material portion.

13. The integrated circuit structure of claim 11, wherein the first dielectric material portion and the second dielectric material portion comprise a low-k dielectric material.

14. The integrated circuit structure of claim 13, wherein the low-k dielectric material selected from the group consisting of carbon doped silicon dioxide, porous silicon dioxide.

15. The integrated circuit structure of claim 11, wherein the third dielectric material portion comprises $SiO_xC_yN_z$.

16. The integrated circuit structure of claim 11, wherein the first interconnect line and the through via structure are spaced apart by a pitch, and wherein the pitch is less than 60 nanometers.

17. The integrated circuit structure of claim 11, wherein the through via structure has a width less than 30 nanometers.

18. The integrated circuit structure of claim 11, wherein the first interconnect line and the through via structure have a same metal composition.

19. The integrated circuit structure of claim 11, wherein the first interconnect line and the through via structure have a different metal composition.

20. The integrated circuit structure of claim 11, wherein the through via structure comprises copper.

* * * * *